United States Patent
Lin et al.

(10) Patent No.: US 10,155,879 B2
(45) Date of Patent: Dec. 18, 2018

(54) COMPOSITIONS AND USE THEREOF FOR MODIFICATION OF SUBSTRATE SURFACES

(71) Applicant: AZ ELECTRONIC MATERIALS (LUXEMBOURG) S.A.R.L., Luxembourg (LU)

(72) Inventors: Guanyang Lin, Whitehouse Station, NJ (US); Hengpeng Wu, Hillsborough, NJ (US); JiHoon Kim, North Wales, PA (US); Jian Yin, Bridgewater, NJ (US); Durairaj Baskaran, Bridgewater, NJ (US); Jianhui Shan, Branchburg, NJ (US)

(73) Assignee: AZ Electronic Materials (Luxembourg) S.à.r.l., Luxembourg (LU)

(*) Notice: Subject to any disclaimer, the term of this patent is extended or adjusted under 35 U.S.C. 154(b) by 223 days.

(21) Appl. No.: 14/975,969

(22) Filed: Dec. 21, 2015

(65) Prior Publication Data
US 2017/0174931 A1 Jun. 22, 2017

(51) Int. Cl.
| | | |
|---|---|---|
| C09D 151/00 | (2006.01) |
| C09D 133/08 | (2006.01) |
| C09D 135/06 | (2006.01) |
| B05D 3/02 | (2006.01) |
| H01L 21/324 | (2006.01) |
| H01L 21/027 | (2006.01) |
| H01L 21/02 | (2006.01) |

(52) U.S. Cl.
CPC ........... *C09D 151/003* (2013.01); *B05D 3/02* (2013.01); *C09D 133/08* (2013.01); *C09D 135/06* (2013.01); *H01L 21/0271* (2013.01); *H01L 21/02118* (2013.01); *H01L 21/324* (2013.01)

(58) Field of Classification Search
CPC ........................ C09D 151/003; C09D 133/08; C09D 135/06; H01L 21/324; H01L 21/0271; H01L 21/02118; B05D 3/02
USPC ...................................................... 524/317
See application file for complete search history.

(56) References Cited

U.S. PATENT DOCUMENTS

| | | |
|---|---|---|
| 4,555,574 A | 11/1985 | Yuki et al. |
| 4,752,629 A | 6/1988 | Proudlock et al. |
| 5,135,831 A | 8/1992 | Kato |
| 5,571,825 A | 11/1996 | Boschelli et al. |
| 6,911,400 B2 | 6/2005 | Colburn et al. |

(Continued)

FOREIGN PATENT DOCUMENTS

| | | |
|---|---|---|
| EP | 068290 A1 | 1/1983 |
| EP | 0204444 A1 | 12/1986 |

(Continued)

OTHER PUBLICATIONS

International Search Report, PCT/EP2016/081870, dated Apr. 24, 2017, corresponds to U.S. Appl. No. 14/975,969.

(Continued)

*Primary Examiner* — Angela C Scott
(74) *Attorney, Agent, or Firm* — Francis M. Houlihan

(57) ABSTRACT

The present invention relates to non aqueous, graftable coating composition comprised of a homogenous solution of a polymer and a spin casting organic solvent, where the composition does not contain acidic compounds, coloring particles, pigments or dyes, and the polymer has a linear polymer chain structure which is comprised of repeat units derived from monomers containing a single polymerizable olefinic carbon double bond, and the polymer contains at least one triarylmethyl chalcogenide containing moiety which is selected from the group consisting of repeat units having structure (I) an end chain group unit of structure (II) and mixtures thereof, and the polymer does not contain any repeat units or end groups containing water ionizable groups, ionic groups, free thiol groups, or free hydroxy groups, and where $A_1$, $A_2$, and $A_3$ are independently an Aryl or a substituted Aryl; Y is a chalcogen selected from O, S, Se or Te; $X_1$ and $X_2$ are individually selected organic spacers; $P_1$ is an organic polymer repeat unit moiety derived from a monomer containing a single polymerizable olefinic carbon double bound, and $P_2$ is an end group moiety derived from a monomer containing a single polymerizable olefinic carbon double bound, and ∿∿∿ represents a direct valence bond to the linear polymer.

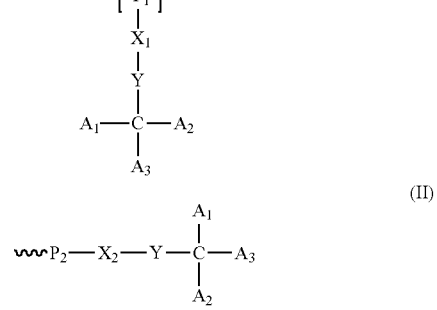

Figure 1A:
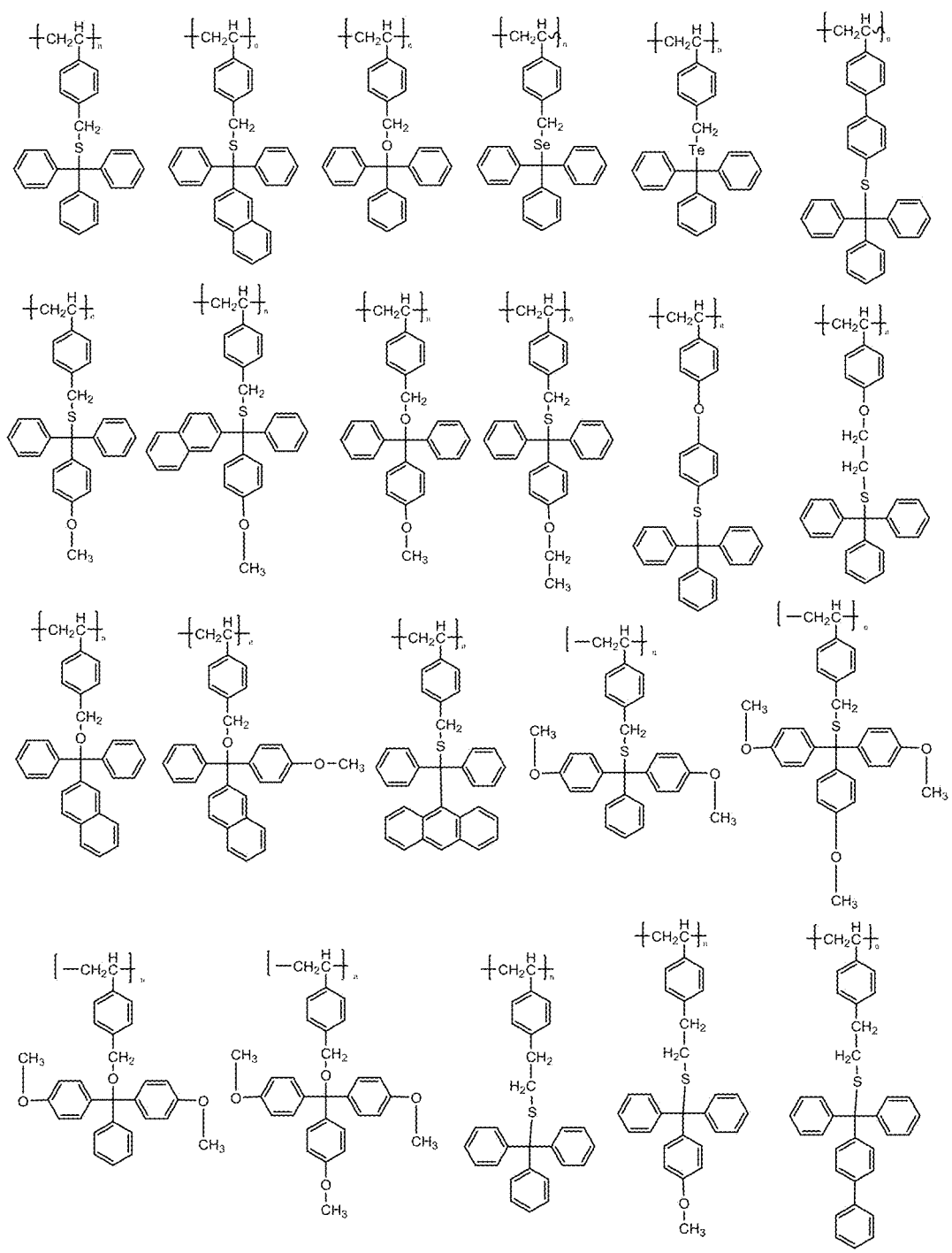

The invention also relates to using this novel coating composition to form a grafted polymer film on a substrate.

17 Claims, 9 Drawing Sheets

(56) References Cited

U.S. PATENT DOCUMENTS

| | | |
|---|---|---|
| 7,948,051 B2 | 5/2011 | Colburn et al. |
| 8,491,987 B2 | 7/2013 | Colburn et al. |
| 2004/0087176 A1 | 5/2004 | Colburn |
| 2009/0131577 A1 | 5/2009 | Kato et al. |
| 2015/0093702 A1 | 4/2015 | Nyhus et al. |

FOREIGN PATENT DOCUMENTS

| | | |
|---|---|---|
| JP | 59-134776 A | 8/1984 |
| JP | 4-183701 A | 6/1992 |
| JP | 2008-138063 A | 6/2008 |
| JP | 2010-189478 A | 9/2010 |
| JP | 2011-105865 A | 6/2011 |
| WO | 2012/052874 A1 | 4/2012 |

OTHER PUBLICATIONS

"Influence of Branching on Sedimentation Behavior in Concentrated Polymer Solutions", Journal of Polymer Science: Polymer Letters Edition vol. 17, pp. 543-pp. 551 (1979).

David et al., "Facile, Efficient Routes to Diverse Protected Thiols and to Their Deprotection and Addition to Create Functional Polymers by Thiol-Ene Coupling", Macromolecules vol. 41, pp. 1151-pp. 1161 (2008).

Dolezalova et al., "Estimation of the Characteristic Ration of Poly[(2-Tyipenyl'methoxy)Ethyl Methacrylate] From Hydrodynamic Properties of Its Dilute Solutions", European Polymer Journal vol. 12, pp. 701-pp. 706 (1976).

Dondos et al., "Characteristic numbers of Polymers in dilute solution : a universal description of the cross-over effects", J. Physique vol. 48, pp. 1439-pp. 1443 (1987).

Inman et al., "In Situ Deprotection and Assembly of S-Tritylalkanethiols on Gold Yields Monolayers Comparable to Those Prepared Directly from Alkanethiols", Langmuir vol. 20, pp. 9144-pp. 9150 (2004).

Negioglu et al., "New UV-Curable High Refractive Index Oligomers", Ind. Eng. Chem. Res. vol. 47, pp. 2155-pp. 2159 (2008).

Negioglu et al., "New UV-Curable High Refractive Index Oligomers", RadTech Europe 2007 UVEB The National Choice Conference Proceedings Vienna, Austria (2015).

Phillies et al., "The Ubiquity of Stretched-Exponential Forms in Polymer Dynamics", Macromolecules vol. 21, pp. 214-pp. 220 (1988).

Machine Language English Abstract from Espacenet for JP 4-183701 A.

Machine Language English Abstract from JPO for JP 59-134776 A.

L.F. Thompson, et al, Introduction to Microlithography, ACS Symposium 219, Chapter 4, Resist Processing, MW Bowden, pp. 186-196, (1983).

COMPOSITIONS AND USE THEREOF FOR MODIFICATION OF SUBSTRATE SURFACES

FIELD OF THE INVENTION

The invention relates to novel grafting compositions containing polymers with at least one attached triarylmethyl chalcogenide moiety and a solvent. The invention also related to the process of forming grafted films on a substrate using these compositions and using the grafted films on a substrate for self-assembly.

DESCRIPTION OF THE INVENTION

Grafted polymer which form covalently bound film on the surface of a substrate can be prepared by plasma deposition, electrochemical deposition or self-assembly. The strength of covalent bond predicates the adherence of film, however, these film are generally much more adherent than films which only interact through secondary forces with the surface of the substrate such as those prepared by spin casting. Consequently, because of this higher adherence formation of a grafted polymer film on a substrate material is useful for a variety of applications. Among these are:

One example are biomaterials where substrates are made bio compatible by grafting a polymer at the surface of a material, such as medical prostheses, without compromising bulk mechanical properties.

The grating of polymers on substrate surfaces also has been employed to impart anti-bio fouling of these surfaces or to improve their corrosion resistance.

Coating solutions, where the grafting of a polymer on a substrate surface can change the surface properties of these substrates to affect better coating; also in suspension of metal or metal oxide nanoparticles the coating ability and stability of these suspensions may be improved by the grafting of polymers at the surface of these nanoparticles.

Self-assembly and directed self-assembly, where the grating of polymer brushes on the surface of Silicon or Silicon oxide substrates can be employed for the formation of neutral layer on these surfaces which allow block copolymer to orient their domains perpendicular to the substrate surface during self-assembly or directed self-assembly.

Directed self-assembly of block copolymers is a method useful for generating smaller and smaller patterned features for the manufacture of microelectronic devices in which the critical dimensions (CD) of features on the order of nanoscale can be achieved. Directed self-assembly methods are desirable for extending the resolution capabilities of microlithographic technology. In a conventional lithography approach, ultraviolet (UV) radiation may be used to expose through a mask onto a photoresist layer coated on a substrate or layered substrate. Positive or negative photoresists are useful and these can also contain a refractory element such as silicon to enable dry development with conventional integrated circuit (IC) plasma processing. In a positive photoresist, UV radiation transmitted through a mask causes a photochemical reaction in the photoresist such that the exposed regions are removed with a developer solution or by conventional IC plasma processing. Conversely, in negative photoresists, UV radiation transmitted through a mask causes the regions exposed to radiation to become less removable with a developer solution or by conventional IC plasma processing. An integrated circuit feature, such as a gate, via or interconnect, is then etched into the substrate or layered substrate, and the remaining photoresist is removed. When using conventional lithographic exposure processes, the dimensions of features of the integrated circuit feature are limited. Further reduction in pattern dimensions are difficult to achieve with radiation exposure due to limitations related to aberrations, focus, proximity effects, minimum achievable exposure wavelengths and maximum achievable numerical apertures. The need for large-scale integration has led to a continued shrinking of the circuit dimensions and features in the devices. In the past, the final resolution of the features has been dependent upon the wavelength of light used to expose the photoresist, which has its own limitations. Direct assembly techniques, such as graphoepitaxy and chemoepitaxy using block copolymer imaging, are highly desirable techniques used to enhance resolution while reducing CD variation. These techniques can be employed to either enhance conventional UV lithographic techniques or to enable even higher resolution and CD control in approaches employing EUV, e-beam, deep UV or immersion lithography. The directed self-assembly block copolymer comprises a block of etch resistant copolymeric unit and a block of highly etchable copolymeric unit, which when coated, aligned and etched on a substrate give regions of very high density patterns.

In the graphoepitaxy directed self-assembly method, the block copolymers self organizes around a substrate that is pre-patterned with conventional lithography (Ultraviolet, Deep UV, e-beam, Extreme UV (EUV) exposure source) to form repeating topographical features such as a line/space (L/S) or contact hole (CH) pattern. In an example of a L/S directed self-assembly array, the block copolymer can form self-aligned lamellar regions which can form parallel line-space patterns of different pitches in the trenches between pre-patterned lines, thus enhancing pattern resolution by subdividing the space in the trench between the topographical lines into finer patterns. For example, a diblock copolymer which is capable of microphase separation and comprises a block rich in carbon (such as styrene or containing some other element like Si, Ge, Ti) which is resistant to plasma etch, and a block which is highly plasma etchable or removable, can provide a high resolution pattern definition. Examples of highly etchable blocks can comprise monomers which are rich in oxygen and which do not contain refractory elements, and are capable of forming blocks which are highly etchable, such as methylmethacrylate. The plasma etch gases used in the etching process of defining the self-assembly pattern typically are those used in processes employed to make integrated circuits (IC). In this manner very fine patterns can be created in typical IC substrates than were definable by conventional lithographic techniques, thus achieving pattern multiplication. Similarly, features such as contact holes can be made denser by using graphoepitaxy in which a suitable block copolymer arranges itself by directed self assembly around an array of contact holes or posts defined by conventional lithography, thus forming a denser array of regions of etchable and etch resistant domains which when etched give rise to a denser array of contact holes. Consequently, graphoepitaxy has the potential to offer both pattern rectification and pattern multiplication.

In chemical epitaxy or pinning chemical epitaxy the self-assembly of the block copolymer is formed around a surface that has regions of differing chemical affinity but no or very slight topography to guide the self-assembly process. For example, the surface of a substrate could be patterned with conventional lithography (UV, Deep UV, e-beam EUV) to create surfaces of different chemical affinity in a line and space (L/S) pattern in which exposed areas whose surface chemistry had been modified by irradiation alternate with areas which are unexposed and show no chemical change.

These areas present no topographical difference, but do present a surface chemical difference or pinning to direct self-assembly of block copolymer segments. Specifically, the directed self-assembly of a block copolymer whose block segments contain etch resistant (such as styrene repeat unit) and rapidly etching repeat units (such as methyl methacrylate repeat units) would allow precise placement of etch resistant block segments and highly etchable block segments over the pattern. This technique allows for the precise placement of these block copolymers and the subsequent pattern transfer of the pattern into a substrate after plasma or wet etch processing. Chemical epitaxy has the advantage that it can be fined tuned by changes in the chemical differences to help improve line-edge roughness and CD control, thus allowing for pattern rectification. Other types of patterns such as repeating contact holes (CH) arrays could also be pattern rectified using chemoepitaxy.

Neutral layers are layers on a substrate or the surface of a treated substrate which have no affinity for either of the block segment of a block copolymer employed in directed self-assembly. In the graphoepitaxy method of directed self-assembly of block copolymer, neutral layers are useful as they allow the proper placement or orientation of block polymer segments for directed self-assembly which leads to proper placement of etch resistant block polymer segments and highly etchable block polymer segments relative to the substrate. For instance, in surfaces containing line and space features which have been defined by conventional radiation lithography, a neutral layer allows block segments to be oriented so that the block segments are oriented perpendicular to the surface of the substrates, an orientation which is ideal for both pattern rectification and pattern multiplication depending on the length of the block segments in the block copolymer as related to the length between the lines defined by conventional lithography. If a substrate interacts too strongly with one of the block segments it would cause it to lie flat on that surface to maximize the surface of contact between the segment and the substrate; such a surface would perturb the desirable perpendicular alignment which can be used to either achieve pattern rectification or pattern multiplication based on features created through conventional lithography. Modification of selected small areas or pinning of substrate to make them strongly interactive with one block of the block copolymer and leaving the remainder of the surface coated with the neutral layer can be useful for forcing the alignment of the domains of the block copolymer in a desired direction, and this is the basis for the pinned chemoepitaxy or graphoepitaxy employed for pattern multiplication.

There is a need for a novel materials which can form a grafted polymer layer on semiconductor (e.g. Si, GaAs, and the like), metal (Cu, W, Mo, Al, Zr, Ti, Hf, Au and the like) and metal oxide (Copper oxide, Aluminum oxide, Hafnium oxide, Zirconium oxide, Titanium oxide and the like) substrates through a simple spin coating, followed by a post coat bake to affect chemical bonding without the presence of activating components to promote the grafting reaction on the substrate such as acidic compounds, thermal acid generators, photoacid generator, thermal radical generators, photochemical radical generators, basic additives, thermal base generators or photobase generators. The presence of such thermally or photochemically reactive additives compounds is undesirable because the small size and reactivity of these compounds, they may lead them to diffuse out of the grafted film into other layers causing undesirable reaction such as corrosion. Another need is for a grafting material in which graftable polymer does not contain overly reactive grafting sites which may deleteriously affect shelf life of solutions of a grafting solution in an organic solvent such as a spin casting solvent. There is also a need for novel grafting material than can be made to have selective grafting towards specific types of substrates by altering grafting bake. In this manner one can alter the surface properties of these materials, such as coat-ability, and corrosion resistance by a simple spin coating process without having to use plasma deposition or electrochemical grating, and also in the case of a novel selective grafting process using the novel materials of this invention, in one step coat only one type of material on a substrate which contains a topographical or chemical pattern in which different materials are present on one substrate. There is also a need for novel neutral layer compositions which when formed into a layer remain neutral to the self-assembly block copolymer and yet are not damaged by processing steps of directed self-assembly techniques, and can further enhance the lithographic performance of the directed self-assembly materials and processes, especially reducing the number of processing steps and providing better pattern resolution with good lithographic performance. There is also a need for coat-able pinning materials for small areas of metal or metal oxide substrates otherwise coated with a neutral layer, for instance in the chemoepitaxy approach, in order to force the domains oriented perpendicularly with the neutral layer substrate to force the alignment of the domains in a desired direction. There is also a need for a grafting composition that will selectively only graft on one type of material on a substrate containing a pattern with different materials to create a pinning area.

The present invention relates to novel coating composition which when coated on a substrates and baked can produce an insoluble grafted film. This film may act as a protective barrier layer or in self-assembly of an overlying block copolymer layer serve either as a pinning layer or neutral layer material. These compositions contain an organic solvent and a linear polymer with repeat units derived from olefinic polymerization of a monomer containing a single olefinic double bond where the polymer contains at least one attached moiety based on a triarylmethyl chalcogenide that can undergo grating when the composition is coated on a substrate without need of any additives to assist the grafting process and without the need of highly reactive grafting pendant sites on the polymer such as thiols, alcoholic reactive groups (e.g. $CH_2OH$), carboxylate (i.e. $—CO_2H$), sulfonate (i.e. $—SO_3H$), amino (i.e. $—NH_2$), and the like which may be deleterious to either shelf life of the composition and/or grafting selectivity of the film on different substrates.

DETAILED DESCRIPTION OF DRAWINGS

FIG. 1a Non limiting examples of novel polymers comprised of repeat units having structure (V).

Figure 1B:
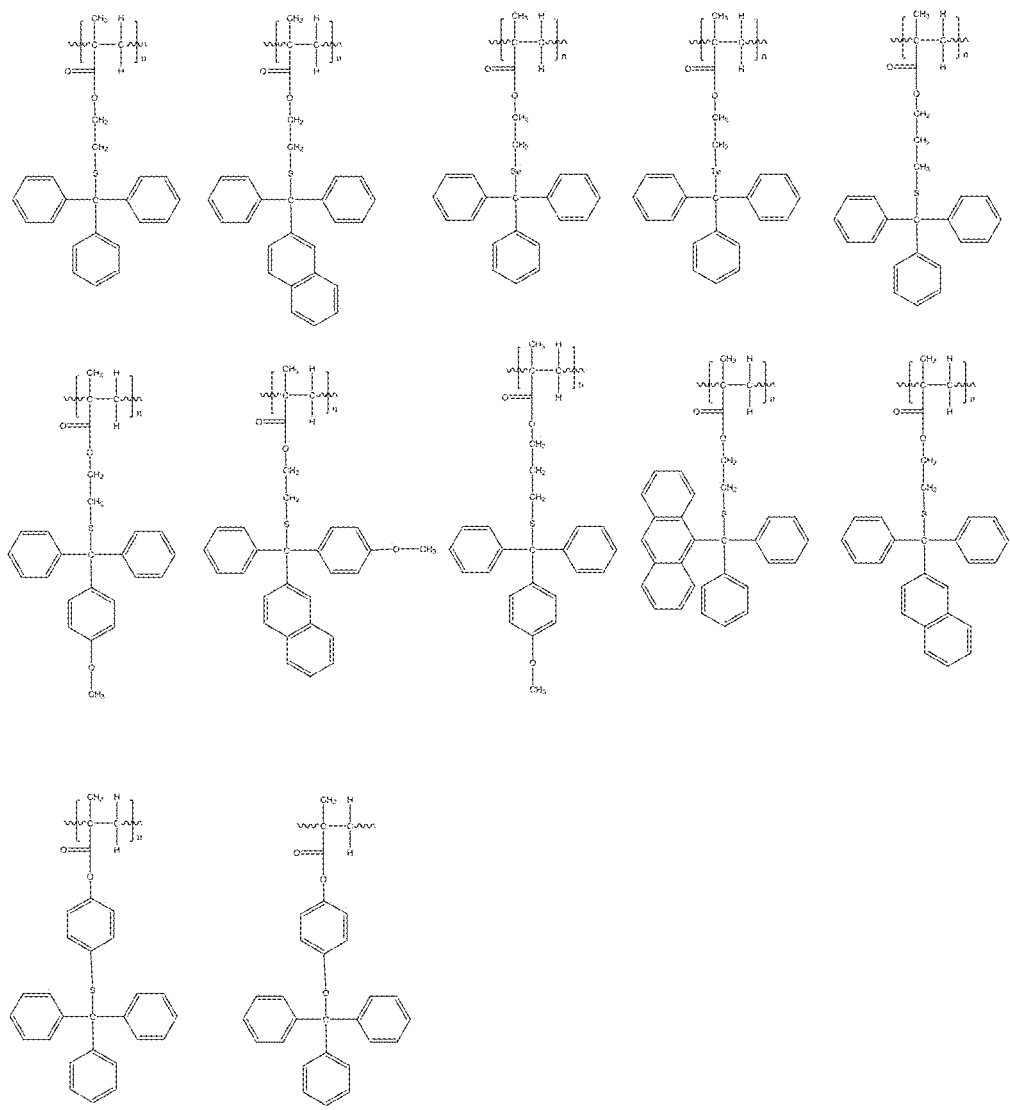

FIG. 1b. Non limiting examples of novel polymer structures comprised of repeat units having structure (III).

Figure 2:
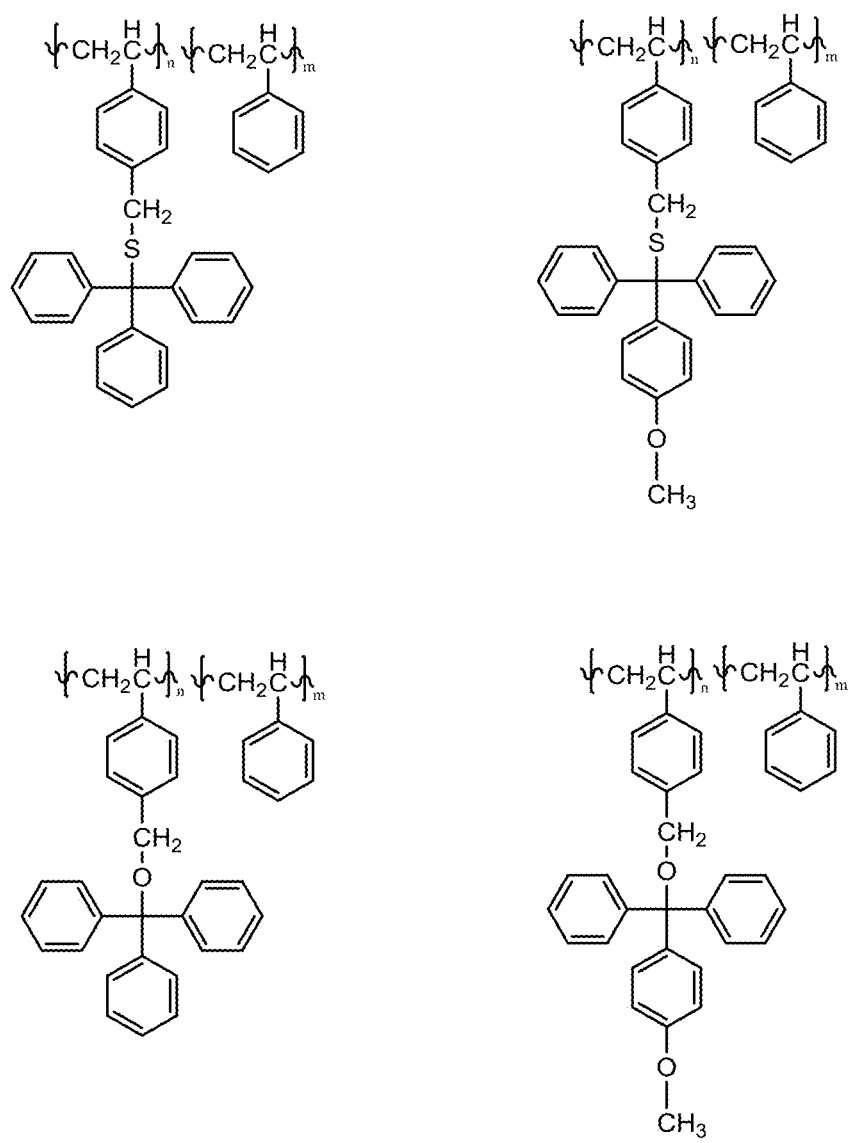
Figure 3:
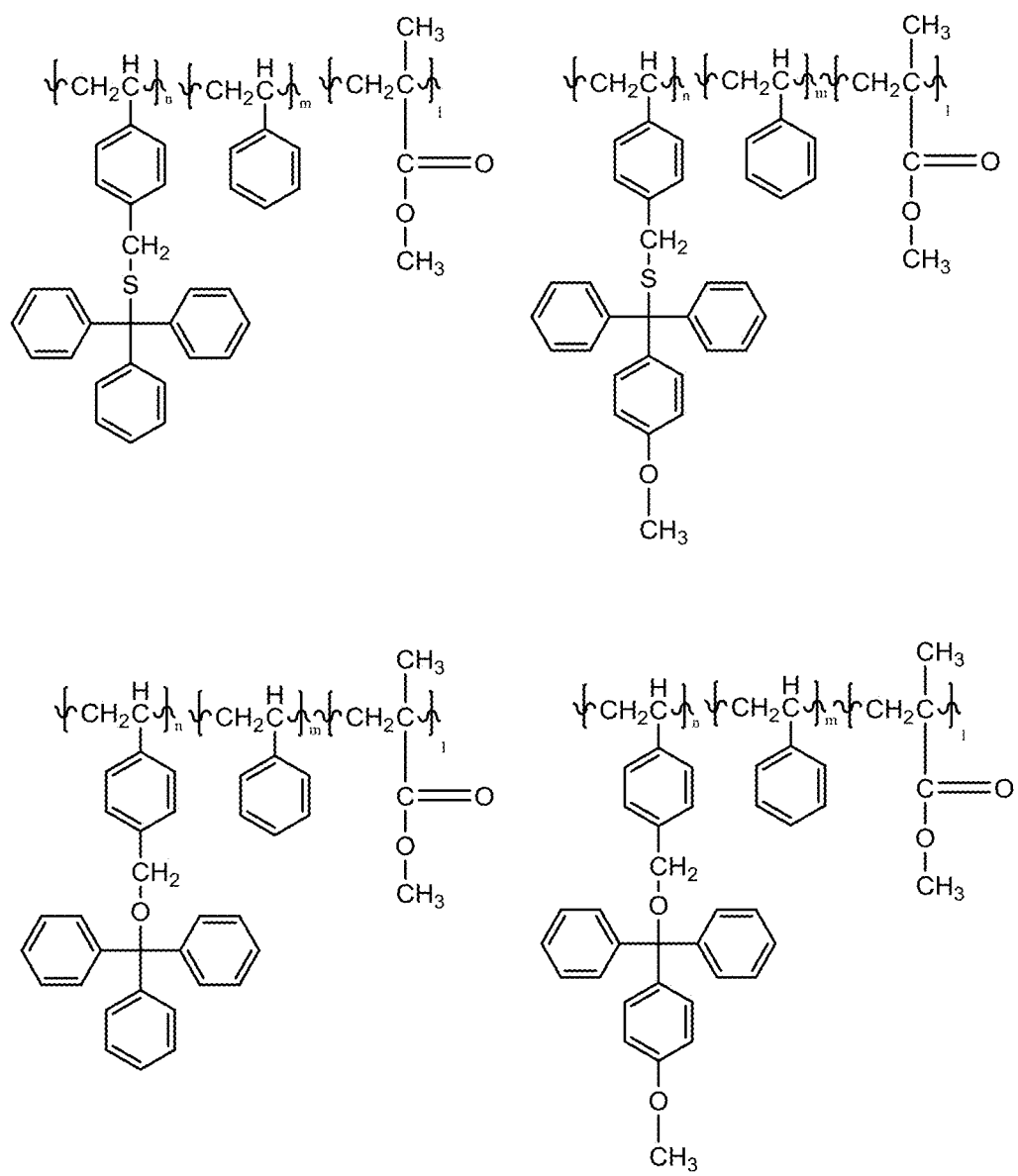

FIG. 2 Non limiting examples of novel polymer structures where the novel polymer is randomly comprised of repeat units having structure (V), and repeat units derived from a vinyl aryl not containing a triphenylmethyl chalcogenide moiety FIG. 3 Non limiting examples of novel polymer structures where the novel polymer is randomly comprised of repeat units having structure (V), and repeat units derived from a vinyl aryl not containing a triphenylmethyl chalcogenide moiety such as styrene or a substituted styrene and also an alkyl acrylate or alkyl methacrylate not containing a triphenylmethyl chalcogenide.

Figure 4:
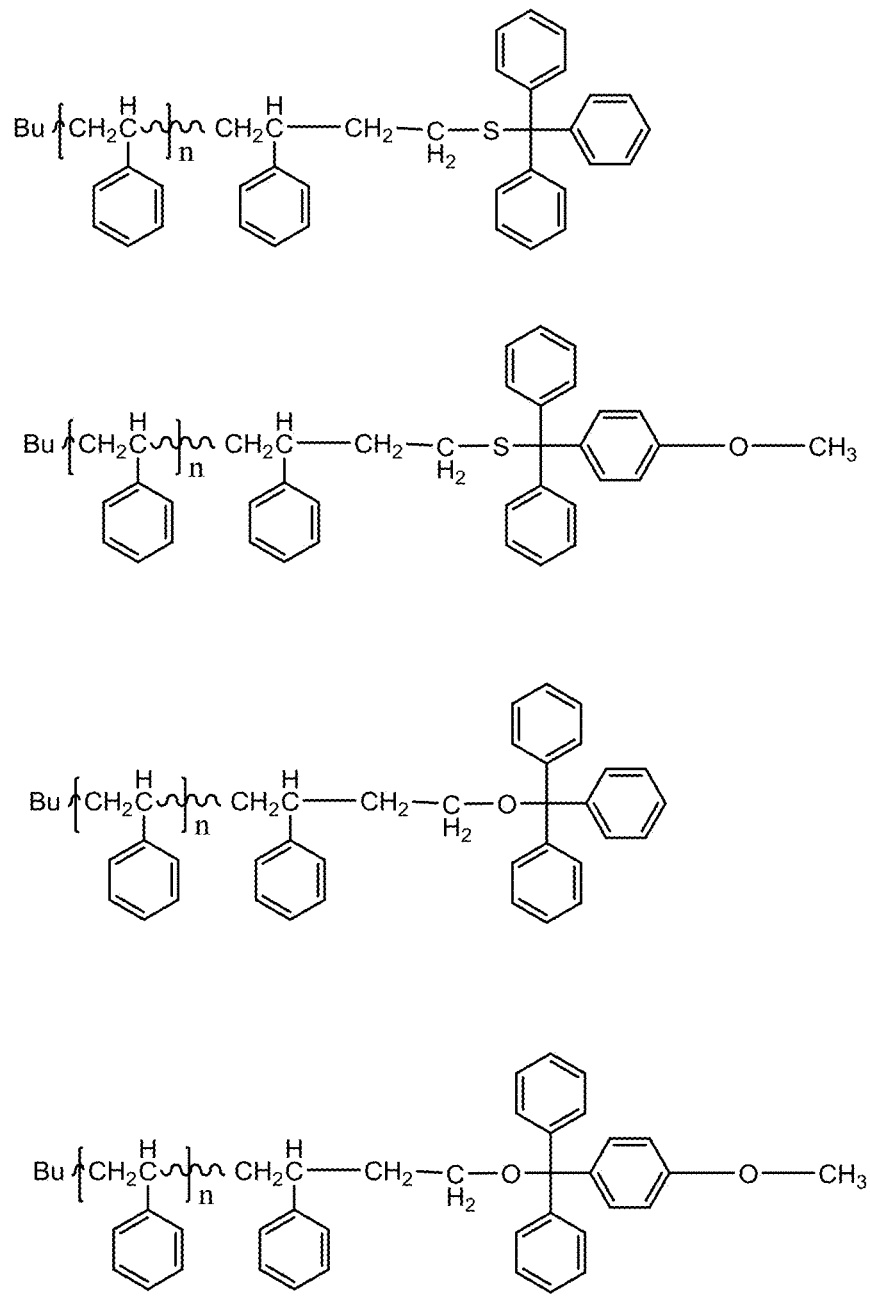

FIG. 4 Non limiting examples of novel polymer structures where the novel polymer's main chain is randomly comprised of repeat units derived from vinyl aryl moieties which do not contain a triphenylmethyl chalcogenide moiety but where these polymers have an end group containing a triphenylmethyl chalcogenide moiety and where this end group has structure (Va).

Figure 5:
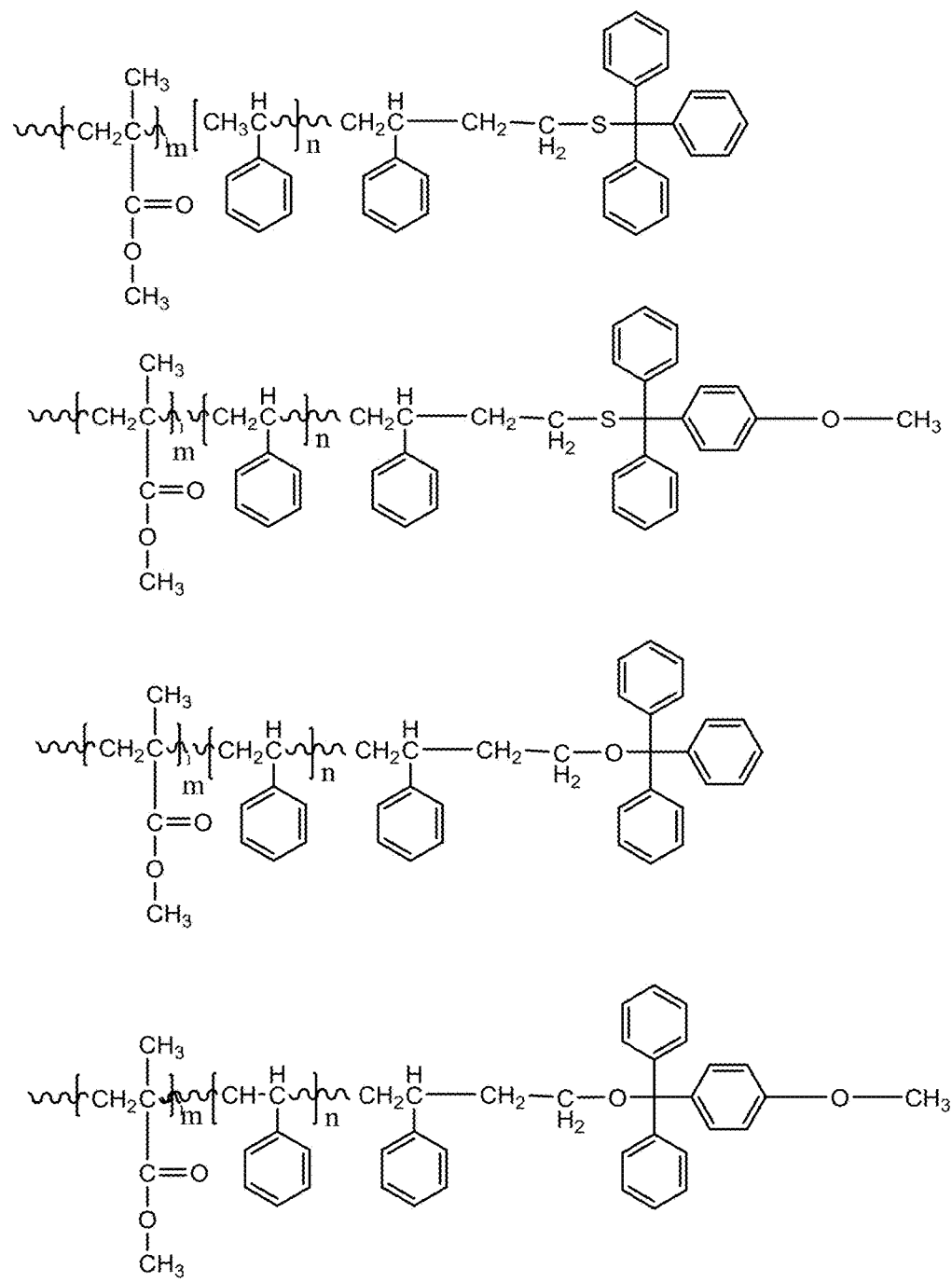

FIG. 5 Non limiting examples of novel polymer structures where the novel polymer's main chain is randomly comprised of both repeat units derived from a vinyl aryl moieties and alkyl acrylates or alkyl methacrylates which do not contain a triphenylmethyl chalcogenide moiety but where these polymers have an end group containing a triphenylmethyl chalcogenide moiety and where this end group has structure (Va).

Figure 6:
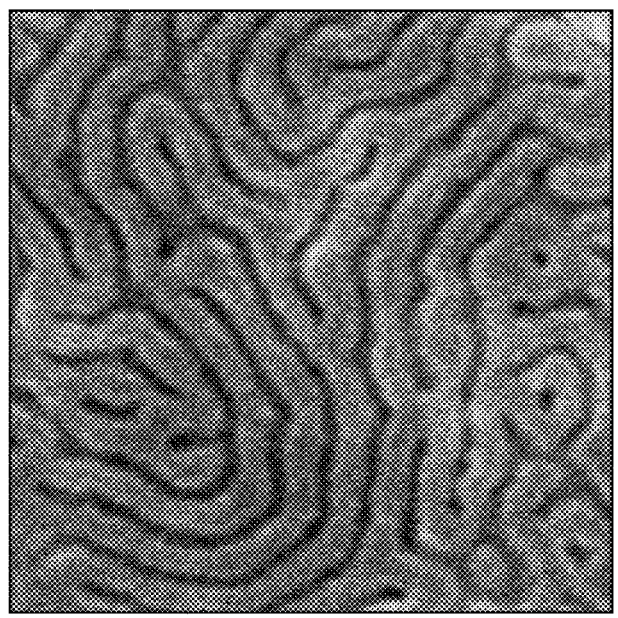

FIG. 6 e-beam images in a 0.5×0.5 μm field of a Self-Assembled fingerprint pattern in a AZEMBLY™ EXP PME-120 coating 35 (Lo=28 nm, film thickness is 35 nm at 1500 rpm) and annealed at 250° C. on a grafted film of the material of Synthesis Example 6 on a copper wafer coupon.

Figure 7A:
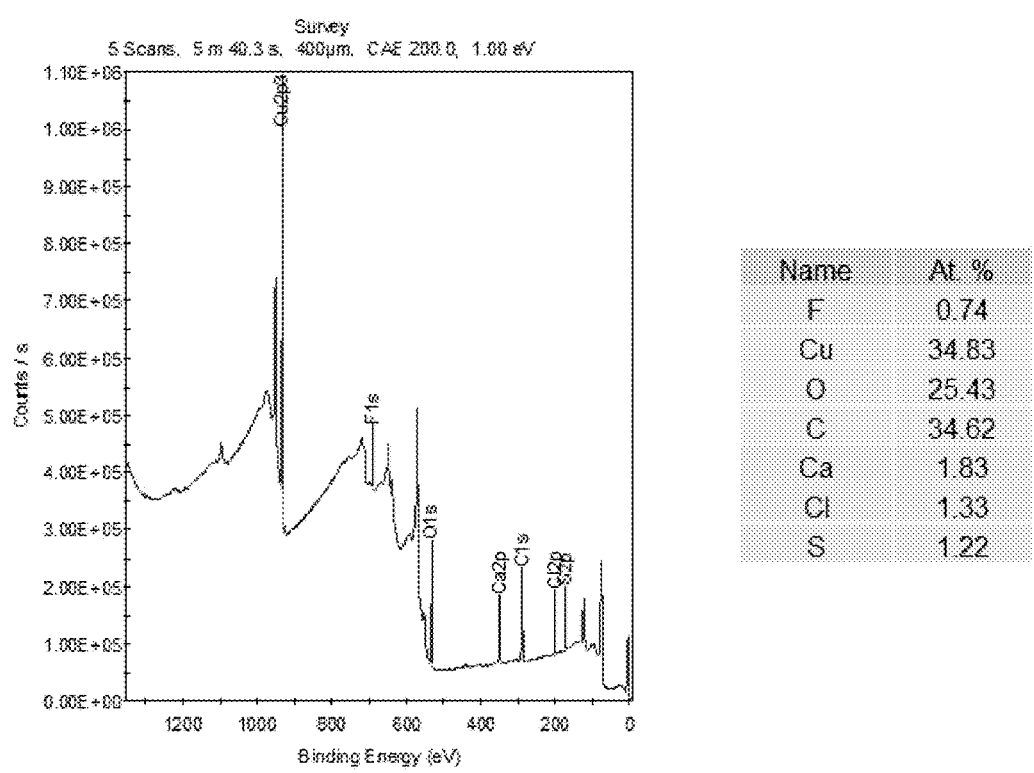

FIG. 7a XPS spectra of copper wafer before grafting of the material of Synthesis Example 6.

Figure 7B:
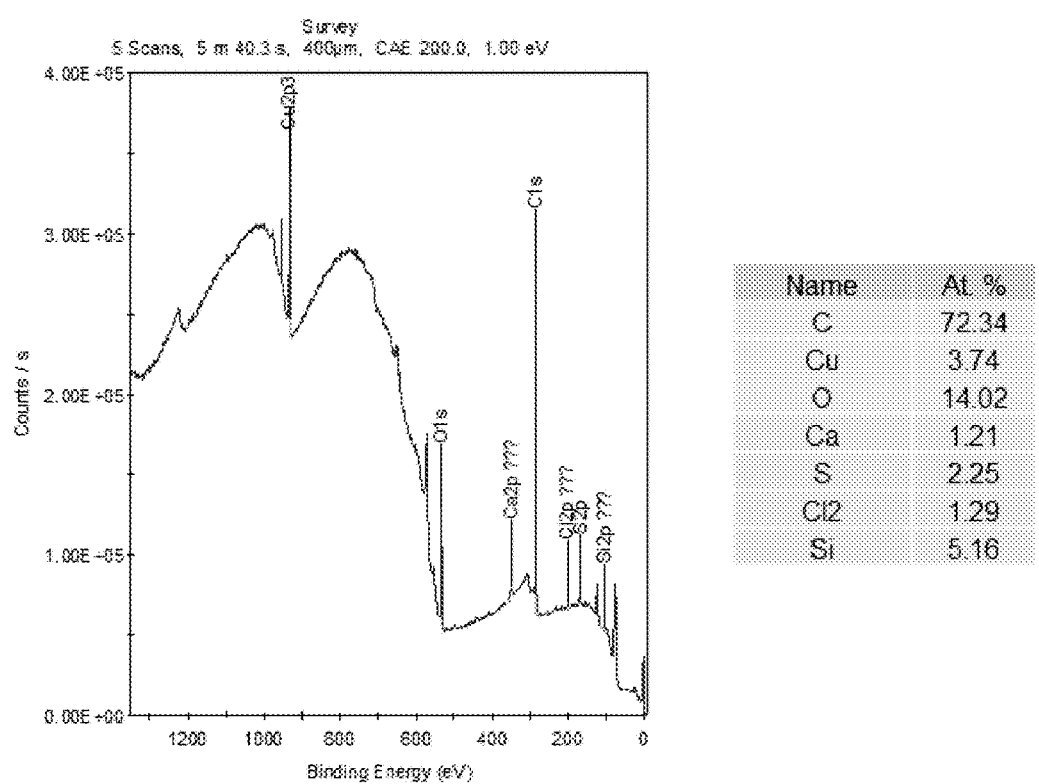

FIG. 7b XPS spectra of copper wafer after grafting of the material of Synthesis Example 6.

SUMMARY OF INVENTION

The present invention relates to a non-aqueous, graftable coating composition comprised of a homogenous solution of a polymer and a spin casting organic solvent. This composition does not contain acidic compounds, coloring particles, pigments or dyes. The polymer of this composition has a linear polymer chain structure which is comprised of repeat units derived from monomers containing a single polymerizable olefinic carbon double bond, and the polymer contains at least one triarylmethyl chalcogenide containing moiety which is selected from the group consisting of repeat units having structure (I) an end chain group unit of structure (II) and mixtures thereof and does not contain repeat units or end groups containing pendant acidic groups, water ionizable groups, ionic groups, free thiol groups, or free hydroxy groups.

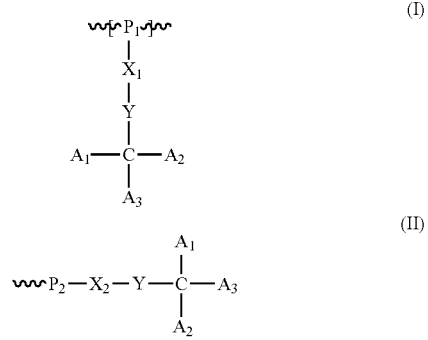

Where in (I) and (II), $A_1$, $A_2$, and $A_3$ are independently selected from an Aryl or a substituted Aryl; Y is a chalcogen selected from O, S, Se or Te; $X_1$ and $X_2$ are individually selected organic spacers; $P_1$ is an organic polymer repeat unit moiety derived from a monomer containing a single polymerizable olefinic carbon double bound; and $P_2$ is an end group moiety derived from a monomer containing a single polymerizable olefinic carbon double bound, and ⁓⁓⁓ represents a direct valence bond to the linear polymer.

The invention also pertains to the process of using this composition to form a grafted polymer film on a substrate.

DETAILED DESCRIPTION OF THE INVENTION

As used herein, unless otherwise indicated, the following terms are as defined here:

The term aryl refers to an aromatic moiety with one attachment point (e.g. phenyl, anthracyl, naphthyl and the like). Apart from the attachment point, aryl group may be substituted with alkyl groups, alkyloxy, trialkylsilyl, trialkylsilyloxy, aryl, aryloxy groups or halides (e.g. F, Cl, I, Br).

The term arylene refers to an aromatic moiety with more than 1 attachment point (e.g. phenylene, anthracylene, napthylene and the like). Apart from the attachment points, arylene group may be substituted with alkyl groups, or halides (e.g. F, Cl, I, Br) or aryl groups. These aryl and arylene moieties may contain $C_6$-$C_{20}$ carbons.

The term alkyl refers to a linear, branched or cyclic alkane moiety with one attachment point (e.g. methyl, ethyl, propyl, n-butyl, tert-butyl, cyclohexyl and the like). Apart from the attachment point, alkyl groups may be substituted with alkyl groups, aryl groups or halides (e.g. F, Cl, I, Br). The number of carbons for specific alkyl moieties are as follows: $C_1$-$C_{10}$ linear alkyl, a $C_3$-$C_{10}$ branched alkyl, a $C_3$-$C_{10}$ cyclic alkyl, a $C_4$-$C_{10}$ alicyclic alkyl.

The term alkylene refers to a linear, branched or cyclic alkane moiety with two attachment point (e.g. methylene, ethylene, propylene and the like). Apart from the attachment points, alkylene groups may be substituted with alkyl groups, aryl groups, or halides (e.g. F, Cl, I, Br). The number of carbons for specific alkyl moieties is as follows: $C_1$-$C_{10}$ linear alkylene, a $C_3$-$C_{10}$ branched alkylene, a $C_3$-$C_{10}$ cyclic alkylene, a $C_4$-$C_{10}$ alicyclic alkylene.

The term alkyloxy refers to a linear, branched or cyclic alkane moiety with one attachment through oxygen (e.g. methoxy, ethoxy, propoxy, n-butoxy, tert-butoxy, cyclohexyloxy and the like). Apart from the attachment point, alkyl groups may be substituted with alkyl groups, aryl groups or halides (e.g. F, Cl, I, Br). The number of carbons for specific alkyl moieties are as follows: $C_1$-$C_{10}$ linear alkyloxy, a $C_3$-$C_{10}$ branched alkyloxy, a $C_3$-$C_{10}$ cyclic alkyloxy, a $C_4$-$C_{10}$ alicyclic alkyloxy.

The term alkylcarbonyloxy refers to a linear, branched or cyclic alkane moiety with one attachment through a carbonyloxy moiety (—C═O—O) (e.g. tert-butyloxycarbonyl, ethyloxycarbonyl, propyloxycarbonyl and the like).

The term aryloxy refers to a aryl moiety as defined as above with on attachment point through an oxygen (e.g. phenyloxy, anthracyloxy and the like)

The term alkylenearyl refers to an alkylene moiety which has one attachment point and an aryl substitutents (e.g. —CH$_2$-Aryl, —CH$_2$—CH$_2$-Aryl, and the like) where the aryl and alkylene moieties are otherwise defined as above.

The term oxyarylene when applied to describe an X moiety in structures (I) or (II), or other structure derived from these, refers to arylene moiety where the arylene moiety is liked to polymer backbone P1 or P2 as defined in structure (I) and (II), or other structures derived from these, through an oxygen (e.g.

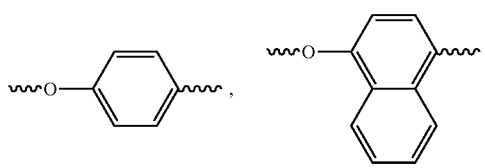

and the like).

The term oxyalkylene when applied to describe an X moiety in structures (I) or (II), or other structure derived from these, refers to a linear, branched, cyclic, or alicyclic alkylene moiety where the alkylene moiety is liked to polymer backbone P1 or P2 as defined in structure (I) and (II), or other structures derived from these, through an oxygen (e.g. —O—$CH_2$—, O—$CH_2$—$CH_2$—, and the like).

The term oxycarbonylalkylene when applied to describe an X moiety in structures (I) or (II), or other structure derived from these, refers to a linear, branched, cyclic, or alicyclic alkylene moiety where the alkylene moiety is liked to polymer backbone P1 or P2 as defined in structure (I) and (II), or other structures derived from these, through an oxycarbonyl moiety (e.g. —O—(C=O)—$CH_2$, —O—(C=O)—$CH_2$—$CH_2$, and the like).

The term oxycarbonyloxyalkylene when applied to describe an X moiety in structures (I) or (II), or other structure derived from these, refers to a linear, branched cyclic, or alicyclic alkylene moiety where the alkylene moiety is liked to polymer backbone P1 or P2 as defined in structure (I) and (II), or other structures derived from these, through an oxycarbonyloxy moiety (e.g. —O—(C=O)—O—$CH_2$, —O—(C=O)—O—$CH_2$—$CH_2$, and the like)

The term carbonylalkylene when applied to describe an X moiety in structures (I) or (II), or other structure derived from these, refers to a linear, branched, cyclic, or alicyclic alkylene moiety where the alkylene moiety is liked to polymer backbone P1 or P2 as defined in structure (I) and (II), or other structures derived from these, through a carbonyl moiety (e.g. —(C=O)—O—$CH_2$—, —(C=O)—O—$CH_2$—$CH_2$, and the like)

The term carbonyl —N(R')-alkylene when applied to describe an X moiety in structures (I) or (II), or other structure derived from these, refers to a linear, branched cyclic, or alicyclic alkylene moiety where the alkylene moiety is liked to polymer backbone P1 or P2 as defined in structure (I) and (II), or other structures derived from these, through a carbonyl-N(R')— moiety (e.g. —(C=O)—N(R')—$CH_2$—, —(C=O)—N(R')—$CH_2$—$CH_2$, and the like) and R'— is hydrogen, an alkyl, or an aryl.

The term trialkylsilyl refers to silicon with three alkyl group as define above and one attachment point (e.g. trimethyl silyl, tributylsilyl, and the like).

The term trialkylsilyloxy refers to a silicon with three alkyl group as define above and one attachment point through an oxygen (e.g. trimethyl silyloxy, tributylsilyloxy, and the like).

The terms fluoroaryl, fluoroarylene, fluoroalkyl, fluoroalkoxy, fluoroalkylene refers to these moieties as described above which are partially or completely fluorinated.

The term "-b-" refers to "-block-" and designates monomer repeat units that form block copolymer. The term "P" refers to "poly" when in front of a monomer acronym it designates the polymerized monomer (e.g. PS, designates poly(styrene) because S is the defined acronym for styrene).

The term "pattern" as it relates to a patterned substrate embodies both areas of a substrate which are flush with the surface but have a different chemical composition than the area the surrounding area, and also topographical features on the surface of the substrate which have a different chemical composition than the area of the substrate surrounding the topographical feature. The term different chemical composition in this context embodies materials chosen from polymer, resists, semiconductors, metal or metal oxides.

The term "acidic compound" refers to compounds which have a have phosphate acid group, a phosphonic acid group, a phosphinic acid group, a sulfuric acid group, a sulfonic group, a sulfinic acid group, or a carboxyl group, or its salt (e.g. a polyvalent metallic salt, or ammonium salt), it also refers to compounds which are strong lewis acids and also lewis adducts such as $AlCl_3$, $AlBr_3$, $FeCl_3$, $BF_3$, $BF_3OMe_2$, and the like.

The term "homogeneous solution of a polymer" refers to a solution in which the polymer is fully dissolved and does not form a suspension, dispersion, or colloidal suspension.

The term acidic pendant group refers to pendant, phosphonic acid group, a phosphinic acid group, a sulfuric acid group, a sulfonic group, a sulfinic acid group, or a carboxyl group.

The term "pendant water ionizable groups", refers to any moiety that can freely dissociate in water.

The term "pendant ionic group" refers a moiety containing a positive and negative charge such as a pendant moiety containing within it a salt structure.

The term "single polymerizable olefinic carbon double bond" refers to a single olefin moiety not conjugated with another olefinic carbon double bond. Where the term olefinic carbon double bond refers to a carbon double bond which is not part or an aromatic ring.

The present invention relates to a non aqueous, graftable coating composition comprised of a homogenous solution of a polymer and a spin casting organic solvent. This composition does not contain acidic compounds, coloring particles, pigments or dyes. The polymer of this composition has a linear polymer chain structure which is comprised of repeat units derived from monomers containing a single polymerizable olefinic carbon double bond, and the polymer contains at least one triarylmethyl chalcogenide containing moiety which is selected from the group consisting of repeat units having structure (I) an end chain group unit of structure (II) and mixtures thereof and does not contain. repeat units or end groups containing pendant acidic groups, ionizable groups, ionic groups, free thiol groups, or free hydroxy groups.

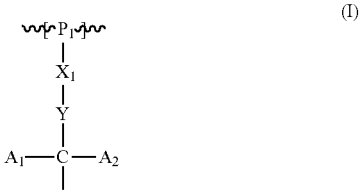

(I)

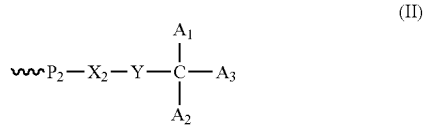

(II)

Where in (I) and (II), $A_1$, $A_2$, and $A_3$ are independently selected from an Aryl or a substituted Aryl; Y is a chalcogen selected from O, S, Se or Te; $X_1$ and $X_2$ are individually selected organic spacers; $P_1$ is an organic polymer repeat unit moiety derived from a monomer containing a single polymerizable olefinic carbon double bound; and $P_2$ is an end group moiety derived from a monomer containing a single polymerizable olefinic carbon double bound, and ~~~ represents a direct valence bond to the linear polymer.

In another embodiment of this invention the composition further does not comprise any additive selected from a photoacid generator, a thermal acid generator, a photobase generator, a thermal base generator, a thermal radical generator, a photo radical generator, a redox initiator, and mixtures thereof In another embodiment of this composition the polymer does not contain any pendant group contain a free amino (i.e. $-NH_2$).

In a further embodiment of composition in the polymer Y is selected from O or S.

In one embodiment of this composition, the polymer has a molecular weight which ranges from about 200 Mw to about 50,000 Mw with a polydispersity ranging from 1 to 2. In a further embodiment the molecule weight ranges from about 500 Mw to about 10,000 Mw with a polydispersity ranging from 1 to 1.5.

In another embodiment of this composition in the polymer $A_1$, $A_2$, and $A_3$ are independently selected from an unsubstituted phenyl, a substituted phenyl, an unsubstituted naphthyl, a substituted naphthyl, an unsubstituted anthracyl, and a substituted anthracyl. In a more specific example of this embodiment $A_1$, $A_2$, and $A_3$ are independently selected from an unsubstituted phenyl or a substituted phenyl. In a further more specific embodiment at least one of $A_1$, $A_2$, or $A_3$ is a substituted phenyl.

In another embodiment of this composition the polymer comprises more than one type of repeat unit (I) and is a random copolymer.

In another embodiment of this novel composition in the polymer at least one of $A_1$, $A_2$, or $A_3$ is a substituted aryl substituted with an alkyloxy moiety. In a more specific example of this embodiment at least one of $A_1$, $A_2$, or $A_3$ is a substituted phenyl substituted with an alkyloxy moiety. In a further more specific embodiment at least one of $A_1$, $A_2$, or $A_3$ is a substituted phenyl substituted with a $C_1$-$C_{10}$ linear alkyloxy.

In one embodiment of this novel composition the composition the polymer in the composition does not contain any repeat units having structure (II) derived from (triphenyl)methyl thioacrylate, (triphenyl)methyl thiomethacrylate, (triphenyl)methyl acrylate, (triphenyl)methyl methacrylate, or 2-(triphenyl)methyloxy)ethyl methacrylate.

In another embodiment of this novel composition the polymer comprises at least one repeat unit (I), but does not contain any end group having structure (II). In a more specific example of this embodiment, the polymer has Y selected from O or S.

In another embodiment of this novel composition the polymer comprises at least more than one repeat unit (I), but does not contain any end group having structure (II). In a more specific example of this embodiment, the polymer has Y selected from O or S.

In yet another embodiment of this novel composition the polymer comprises an end group of (II) but does not contain any repeat units of structure (I). In a more specific example of this embodiment, the polymer has Y selected from O or S.

In yet another embodiment of this invention the polymer is a random copolymer further comprised of repeat units derived from monomers containing a single polymerizable carbon double bond which do not contain a pendant triarylmethyl chalcogenide.

In another embodiment of this composition in polymer the organic spacers $X_1$, and $X_2$ are independently selected from an alkylene, fluoroalkylene, an oxyalkylene, oxyfluoroalkylene, an arylene, a fluoroarylene, an oxyarylene, a carbonylalkylene, a carbonyloxyalkylene, an oxycarbonyloxyalkylene, or a carbonyl $-N(R')-$) alkylene, where R' is hydrogen, an alkyl, or an aryl, and further where in substitutents having different possible attachment points "*" designates the attachment point to either a repeat unit $P_1$ or $P_2$ as follows: *oxyalkylene, *oxyfluoroalkylene, *oxyarylene, *carbonylalkylene, *carbonyloxyalkylene, *oxycarbonyloxyalkylene, *carbonyl $-N(R')-$) alkylene. In a more specific example of this embodiment the organic spacers $X_1$ and $X_2$ are independently selected from an alkylene.

In another embodiment of this the polymer the repeat units (I) have structure (Ia), and the end chain group units (II) have structure (IIa),

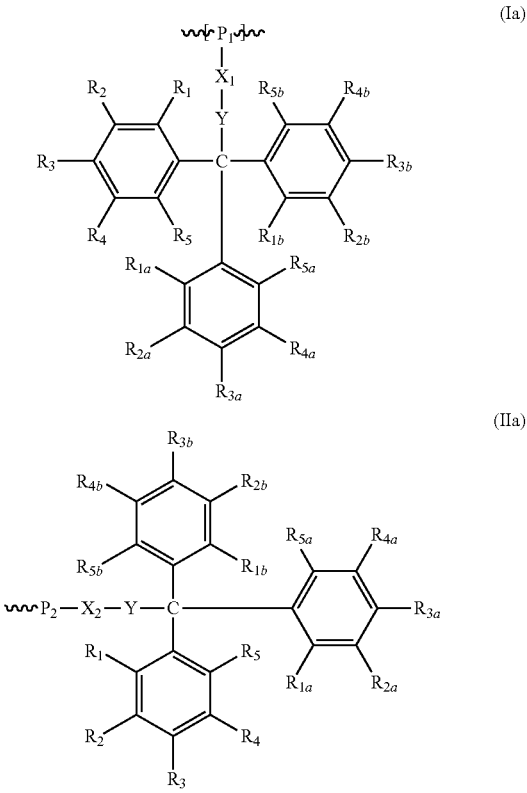

where $R_1$, $R_2$, $R_3$, $R_4$, $R_5$ $R_{1a}$, $R_{2a}$, $R_{3a}$, $R_{4a}$, $R_{5a}$, $R_{1b}$, $R_{2b}$, $R_{3b}$, $R_{4b}$, and $R_{5b}$ are independently a hydrogen, an alkyl, an alkyloxy, an alkyloxycarbonyl, an alkoxyloxycarbonyloxy, a fluoroalkyl, a fluoroalkyloxy, an aryloxy, an aryloxycarbonyl, an aryloxycarbonyloxy, a trialkylsilyl, a trialkylsilyloxy, Cl, Br, or I.

In another embodiment of this composition where the polymer contains structures (Ia) or (IIa), one or more of $R_1$, $R_2$, $R_3$, $R_4$, $R_5$ $R_{1a}$, $R_{2a}$, $R_{3a}$, $R_{4a}$, $R_{5a}$, $R_{1b}$, $R_{2b}$, $R_{3b}$, $R_{4b}$, or $R_{5b}$ is an alkoxy.

In another embodiment of this composition where the polymer contains structures (Ia) or (IIa), the repeat units of structure (Ia) are selected from ones having structure (III), structure (IV), structure (V), structure (VI) and mixtures thereof;

(III)

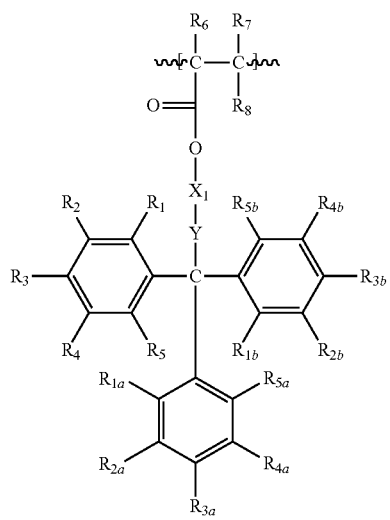

(IV)

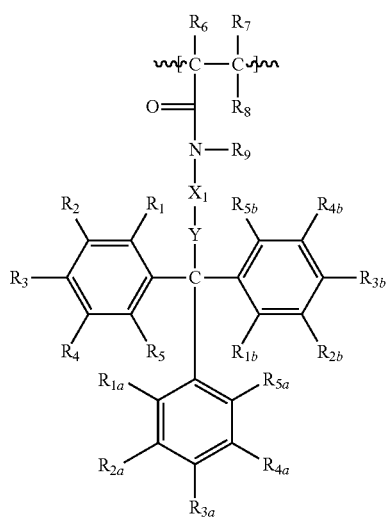

(V)

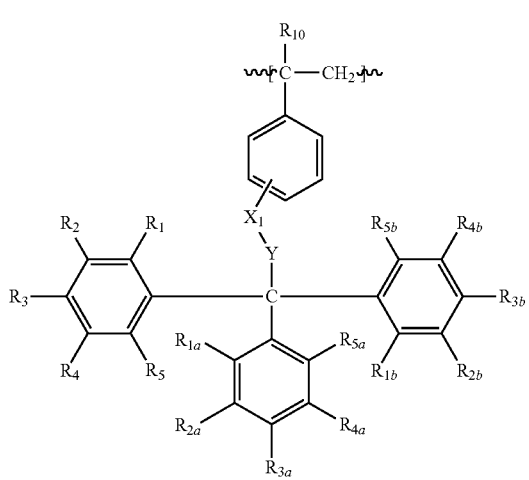

(VI)

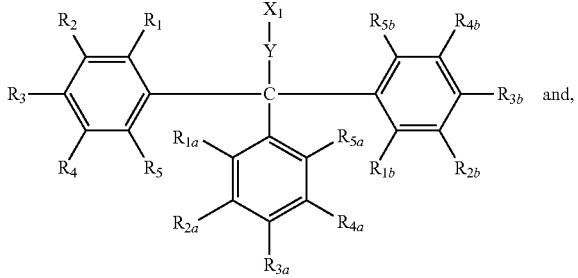

where $R_6$ is a hydrogen, Cl, Br, CN, an alkyl, or a fluoroalkyl; $R_7$ and $R_8$ are independently hydrogen, an alkyl, an alkoxycarbonyl, or $CO_2H$; $R_9$ is hydrogen or an alkyl; $R_{10}$ is a hydrogen or an alkyl; $R_{11}$ is a hydrogen or an alkyl; $R_{12}$ and $R_{13}$ are independently hydrogen or an alkyl. In a more specific example of this embodiment the polymer is comprised of repeat units selected from ones having structure (III), structure (V) or mixtures thereof. In a further more specific example of this the polymer is comprised of repeat units having structure (III). In another more specific example of this embodiment the polymer is comprised of repeat units having structure (V). In another embodiment of this composition in the polymer one or more of $R_1$, $R_2$, $R_3$, $R_4$, $R_5$ $R_{1a}$, $R_{2a}$, $R_{3a}$, $R_{4a}$, $R_{5a}$, $R_{1b}$, $R_{2b}$, $R_{3b}$, $R_{4b}$, or $R_{5b}$ is an alkoxy.

In another embodiment of the composition where in the comprises having structure (III), structure (IV), structure (V), structure (VI) and mixtures thereof it may be further randomly comprised of repeat units derived from monomers containing a single polymerizable olefinic carbon double bond which do not contain a triphenylmethyl chalcogenide moiety.

In another embodiment of this composition where the polymer contains structures (Ia) or (IIa), the end group of structure (IIa) is selected from ones having structure (IIIa), structure (IVa), structure (Va) and structure (VIa);

(IIIa)

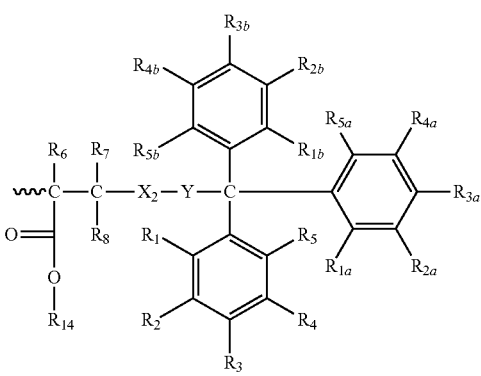

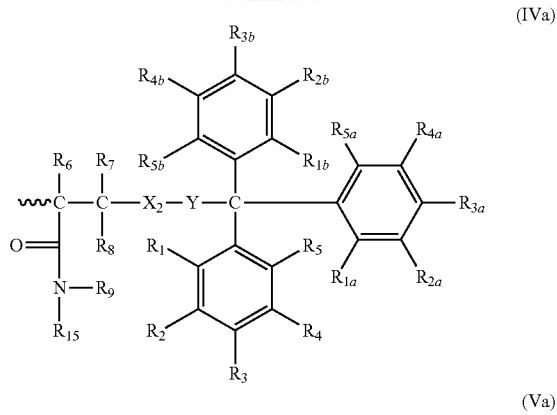

(IVa)

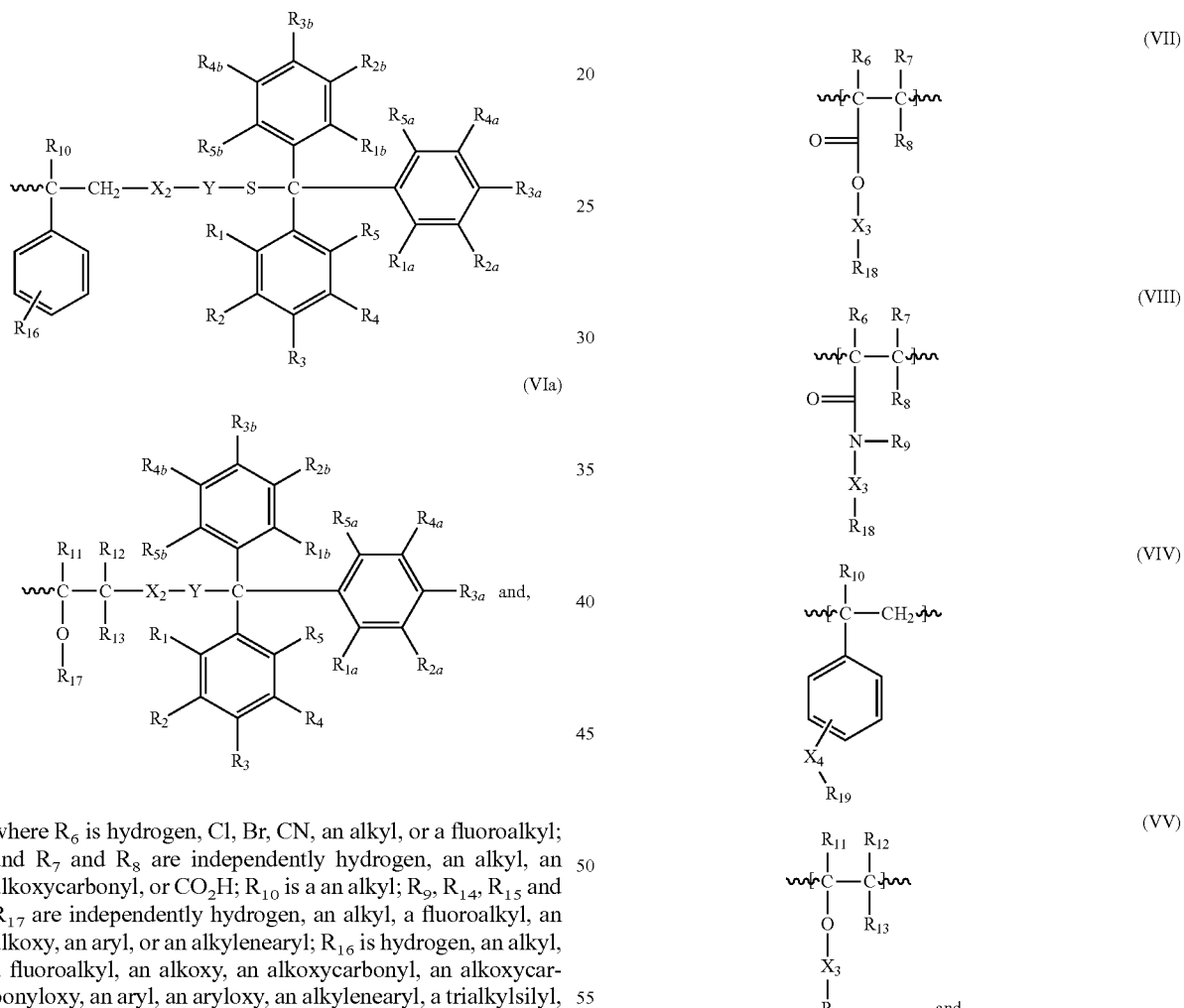

where $R_6$ is hydrogen, Cl, Br, CN, an alkyl, or a fluoroalkyl; and $R_7$ and $R_8$ are independently hydrogen, an alkyl, an alkoxycarbonyl, or $CO_2H$; $R_{10}$ is a an alkyl; $R_9$, $R_{14}$, $R_{15}$ and $R_{17}$ are independently hydrogen, an alkyl, a fluoroalkyl, an alkoxy, an aryl, or an alkylenearyl; $R_{16}$ is hydrogen, an alkyl, a fluoroalkyl, an alkoxy, an alkoxycarbonyl, an alkoxycarbonyloxy, an aryl, an aryloxy, an alkylenearyl, a trialkylsilyl, or a trialkylsiloxy. In a more specific embodiment of this example the polymer is comprised of an end group having structure (IIIa). In another embodiment of this composition in the polymer one or more of $R_1$, $R_2$, $R_3$, $R_4$, $R_5$, $R_{1a}$, $R_{2a}$, $R_{3a}$, $R_{4a}$, $R_{5a}$, $R_{1b}$, $R_{2b}$, $R_{3b}$, $R_{4b}$, or $R_{5b}$ is an alkoxy.

In another specific example, the polymer is comprised on an end group having structure (Va).

In another embodiment of this composition where in the polymer the end group of structure (IIa) is selected from ones having structure (IIIa), structure (IVa), structure (Va) and structure ((VIa)) the polymer is further randomly comprised of repeat units derived from monomers containing a single polymerizable olefinic carbon double bond which do not contain a triphenylmethyl chalcogenide moiety.

In another embodiment of composition where in the polymer the repeat units (I) have structure (Ia), and the end chain group units (II) have structure (IIa) the polymer further comprises polymer repeat units not having a pendant triarylmethyl chalcogenide moieties selected from ones having structures (VII), (VIII), (VIV), and (VV), where $X_3$ is an alkylene, a fluoroalkylene, an arylene, a fluoroarylene, a carbonyl, a carbonyloxy, or a direct valence bond, $X_4$ is an alkylene, a fluoroalkylene, an arylene spacer, a fluoroarylene, an oxy, a carbonyl, a carbonyloxy, an oxycarbonyloxy or a direct valence bond, $R_{18}$ is H, an alkyl, a fluoroalkyl, a trialkylsilyl, an aryl, a fluoroaryl, or an arylene(trialkylsilyl), $R_{19}$ is an alkyl, a fluoroalkyl, a trialkylsilyl, an aryl, a fluoroaryl, or an arylene(trialkylsilyl).

where $X_3$ is an alkylene, a fluoroalkylene, an arylene, a fluoroarylene, a carbonyl, a carbonyloxy, or a direct valence bond, $X_4$ is an alkylene, a fluoroalkylene, an arylene spacer, a fluoroarylene, an oxy, a carbonyl, a carbonyloxy, an oxycarbonyloxy or a direct valence bond, $R_{18}$ is H, an alkyl, a fluoroalkyl, a trialkylsilyl, an aryl, a fluoroaryl, or an arylene(trialkylsilyl), $R_{19}$ is an alkyl, a fluoroalkyl, a trialkylsilyl, an aryl, a fluoroaryl, or an arylene(trialkylsilyl).

In yet another embodiment of this composition in the polymer the repeat units of structure (Ia) are only ones having structure (III) and the polymer further comprises only repeat units not having a pendant triarylmethyl chalcogenide moieties selected from ones having structures (VII), (VIV), and mixtures of these.

In another embodiment of this composition, in the polymer, the repeat units of structure (Ia) are only ones having structure (III) and the polymer further comprises only repeat units not having a pendant triarylmethyl chalcogenide moieties having structure (VII).

In a further embodiment of this composition, in the polymer, the repeat units of structure (Ia) are only ones having structure (III) and the polymer further comprises only repeat units not having a pendant triarylmethyl chalcogenide moieties having structure (VIV).

In yet a further embodiment of this composition in the polymer, the repeat units of structure (Ia) are only ones having structure (V) and the polymer further comprises only repeat units not having a pendant triarylmethyl chalcogenide moieties selected from ones having structures (VII), (VIV), and mixtures of these.

In another embodiment of this composition, in the polymer, the repeat units of structure (Ia) are only ones having structure (V) and where the polymer further comprises only repeat units not having a pendant triarylmethyl chalcogenide moieties having structure (VII).

In yet another embodiment of this composition, in the polymer, the repeat units of structure (Ia) are only ones having structure (V) and the polymer further comprises only repeat units not having a pendant triarylmethyl chalcogenide moieties having structure (VIV). In another embodiment of this composition, the polymer contains at least one triarylmethyl chalcogenide containing moiety is further randomly comprised of repeat units derived from monomers containing a single polymerizable olefinic carbon double bond which do not contain a triphenylmethyl chalcogenide moiety. Non limiting examples of these monomers not containing a triphenylmethyl chalcogenide moiety are vinyl aryls (e.g. styrenes and the like), alkyl vinyls, alkyl acrylates, alkyl methacrylates, vinyl alkyloxides, vinyl alkylcarboxylates, vinyl alcohol, N-alkyl acrylamides and the like. Non limiting examples of alkyl vinyl compounds, alkyloxyvinyl, alkyl acrylate, alkyl methacrylate, vinyl alkyloxides, vinyl alkylcarboxylates, N-alkyl acrylamides that can be employed are ones where the alkyl group is a $C_1$-$C_8$ fluoroalkyl, a $C_1$-$C_{10}$ linear alkyl moiety, a $C_1$-$C_4$ hydroxfluoroalkylene group, a $C_2$-$C_{10}$- alkyloxyalkylene group, a $C_1$-$C_{10}$-hydroxyalkylene group, a $C_3$-$C_{20}$ branched alkyl a $C_3$-$C_{20}$ cyclic alkyl, a $C_2$-$C_{20}$ carboxylalkylene, a $C_3$-$C_{20}$ alkyloxycarboxylalkylene, or a $C_3$-$C_{20}$ alkyloxycarboxyloxyalkylene. The alkyl group in these examples, attached to a carboxyl moiety may also be an acid cleavable group such as a tertiary ester an acetal or ketal capable of releasing a free carboxyl moiety when reacted with a strong acid formed either by a thermal acid generator or a photoacid generator. The alkyl vinyl compound, alkyl acrylate or alkyl methacrylate is to be used as the etch resistant block moiety the alkyl group may be substituted with moieties containing a refractory element such as a $C_3$-$C_{20}$ trialkylsilyl group, a $C_3$-$C_{20}$ trialkylgermanium group, a $C_3$-$C_{20}$ trialkyltin group, or $C_3$-$C_{20}$ trialkyltitanium group. Non limiting examples of vinyl aryl compounds are unsubstituted styrene, unsubstituted vinyl naphthalenes, unsubstituted vinyl anthracite, unsubstituted vinyl pyrene and the like, or these aryl moieties containing one or more substituents such as a $C_1$-$C_{20}$ alkyl group, a $C_1$-$C_{20}$ hydroxy alkyl group, a $C_2$-$C_{10}$- alkyloxyalkylene group, a $C_1$-$C_8$ fluoroalkyl, a $C_1$-$C_8$ hydroxfluoroalkylene group, a hydroxyl group, a hydroxyl group blocked with an acid labile group, a carboxyl group, a carboxyl group blocked with an acid labile group, (these acid cleavable moieties capable of releasing respectively a free hydroxyl or free carboxyl moiety when reacted with a strong acid present in a film formed either by a thermal acid generator or a photoacid generator), a fluoroalcohol group, a $C_3$-$C_{20}$ trialkylsilyl group, a $C_3$-$C_{20}$ trialkylgermanium group, a $C_3$-$C_{20}$ trialkyltin group, a $C_3$-$C_{20}$ trialkyltitanium group, a $C_2$-$C_{20}$ alkylcarbonyl, a $C_2$-$C_{20}$ alkylcarbonyloxy, a $C_1$-$C_{20}$ alkoxy or a $C_9$-$C_{36}$ tris(trialkylsilyl)silyl group, unsubstituted vinyl naphthalene and vinyl naphthalene substituted with, a $C_1$-$C_{20}$ alkyl group, a $C_3$-$C_{20}$ trialkylsilyl group, a $C_3$-$C_{20}$ trialkylgermanium group, a $C_3$-$C_{20}$ trialkyltin group, a $C_3$-$C_{20}$ trialkyltitanium group, a $C_2$-$C_{20}$ alkylcarbonyl, a $C_2$-$C_{20}$ alkylcarbonyloxy, a $C_1$-$C_{20}$ alkoxy, a $C_9$-$C_{36}$ tris(trialkylsilyl)silyl group, vinyl anthracene, a vinyl anthracene substituted with a $C_1$-$C_{20}$ alkyl group, a $C_3$-$C_{20}$ trialkylsilyl group, a $C_3$-$C_{20}$ trialkylgermanium group, a $C_3$-$C_{20}$ trialkyltin group, a $C_3$-$C_{20}$ trialkyltitanium group, a $C_2$-$C_{20}$ alkylcarbonyl, a $C_2$-$C_{20}$ alkylcarbonyloxy, a $C_1$-$C_{20}$ alkoxy, a $C_9$-$C_{36}$ tris(trialkylsilyl)silyl group, vinyl pyrene, a vinyl pyrene substituted with a $C_1$-$C_{20}$ alkyl group, a $C_3$-$C_{20}$ trialkylsilyl group, a $C_3$-$C_{20}$ trialkylgermanium group, a $C_3$-$C_{20}$ trialkyltin group, a $C_3$-$C_{20}$ trialkyltitanium group, a $C_2$-$C_{20}$ alkylcarbonyl, a $C_2$-$C_{20}$ alkylcarbonyloxy, a $C_1$-$C_{20}$ alkoxy or a $C_9$-$C_{36}$ tris(trialkylsilyl)silyl group or the like.

In a further embodiment of this invention in the novel composition, the polymer containing at least one pendant triarylmethyl chalcogenide is only comprised of repeat units having structure (V) or structure (III). FIGS. 1a and 1b, respectively, shows non-limiting Examples of this embodiment where n designates the number of repeat units in the homopolymers. When used as a grafted polymer film on a substrate in directed self-assembly, materials such as the non-limiting examples depicted in FIG. 1a are useful as pinning sites for styrenic domains for the directed self-assembly of block copolymer comprised of a styrenic block and an alkyl methacrylate block. Conversely, grafted polymer films derived from materials such as the one depicted in FIG. 1b are useful as pinning sites for alkyl methacrylate block domains of block polymers comprised of a styrenic block and an alkyl methacrylate block. Similar arguments can be made for analogous homopolymers which are only comprised of repeat units having structures IV and VI.

In another embodiment of the composition, the polymer containing at least one pendant triarylmethyl chalcogenide is randomly comprised of repeat units having structure (V), and repeat units derived from a vinyl aryl not containing a triphenylmethyl chalcogenide moiety such as styrene or a substituted styrene. FIG. 2 shows non-limiting examples of this embodiment where n and m designate the number of each type of repeat units in the random copolymer. In this embodiment the mole % of repeat units having structure (V) ranges from 0.5 to 30 mole % and the mole % of repeat units derived from vinyl aryl not containing a triphenylmethyl chalcogenide range from 70 to 99.5 mole %.

When the polymer containing at least one pendant triarylmethyl chalcogenide in the novel composition consists entirely of styrenic units these compositions are useful in a process of applying a grafted polymer film to a substrate where the grafted polymer film is then useful as a pinning site for styrenic block domains of an overlying block copolymer film comprised of a styrenic block and an alkyl methacrylate block during self-assembly occurring upon annealing of the block copolymer film.

In another embodiment of this invention, in the composition, the polymer is comprised of repeat units having structure (III), (IV) or (VI) randomly copolymerized with repeat units derived from either a alkyl methacrylate, alkyl acrylate, alkyloxy vinyl or N-alkyl acrylamide. Such materials comprising primarily of polar repeating units are useful when grafted on a substrate as pinning sites for polar domains in processes of directed self-assembly of block copolymer comprised of polar domains and non-polar domains such as the non-limiting example of a block copolymer containing styrenic block and block derived from either an alkyl acrylate, alkyl methacrylate, alkyloxy vinyl, or N-alkylacrylamide.

In another embodiment of this invention this invention, the polymer is randomly comprised of repeat units having structure (V), and repeat units derived from a vinyl aryl not containing a triphenylmethyl chalcogenide moiety such as styrene or a substituted styrene and also an alkyl acrylate or alkyl methacrylate not containing a triphenylmethyl chalcogenide. FIG. 3 shows non-limiting Examples of this embodiment where n, m and l designate the number of each type of repeat units. In this embodiment the mole % of repeat units having structure (V) ranges from 0.5 to 30 mole %, the mole % of repeat units derived from vinyl aryl not containing a triphenylmethyl chalcogenide range from 2.0 to 90 mole %, and the mole % of repeat units derived alkyl acrylate or alkyl methacrylate not containing a triphenylmethyl chalcogenide t range from 20 to 90 mole %. When used as a grafted polymer film in directed self-assembly such materials consisting of greater than 90 mole % styrenic units (e.g. in FIG. 3 (n+m)/l>90%) are useful as pinning sites for styrenic domains for the directed self-assembly of block copolymer comprised of a styrenic block and an alkyl methacrylate block. Conversely, materials consisting of greater than 90% alkyl methacrylate units (eg. in FIG. 3 with l/n+m*100>90 mole %) may serve as pinning sites for the alkyl methacrylate block. Also, if the proportion of styrenic units and alkyl methacrylate unit are roughly equal (i.e. in the non-limiting example of FIG. 3 where (n+m)≈l). In one embodiment this copolymer when grafted on a substrate may act as a neutral layer if the mole % of total styrenic repeat units derived from units having structure (V) and styrenic unit not containing a triphenylmethyl chalcogenide moiety ranges from 45-55 mole % and the proportion of alkyl methacrylate or alkyl acrylate ranges from 55-45 mole %. Neutral layers may also be obtained when similar novel polymers are grafted on a substrate where these polymer contain in the same molar proportion units derived from alkyl vinyls, alkyloxy vinyl, or N-alkyl acrylamides instead of repeat units derived from alkyl acrylate or alkyl methacrylates In a further embodiment of this invention the polymer's main chain is randomly comprised of repeat units derived from vinyl aryl moieties which do not contain a triphenylmethyl chalcogenide moiety but have an end group containing a triphenylmethyl chalcogenide moiety where this end group has structure (Va). FIG. 4 shows non limiting examples of such structures. Because these materials are primarily comprised of a vinyl aryl moiety such as repeat units derived from styrenes, when grafted on substrates these materials will act as pinning layer as previous described.

In another embodiment of this invention the polymer's main is randomly comprised of both repeat units derived from a vinyl aryl moieties and alkyl acrylates or alkyl methacrylates which do not contain a triphenylmethyl chalcogenide moiety but have an end group containing a triphenylmethyl chalcogenide moiety where this end group has structure (Va). FIG. 5 shows non limiting examples of such structures. As previously discussed, because such materials contain both polar an non polar repeat units they may act either as pinning layer or neutral layers when grafted as films on a substrate. Thus if the total amount of repeat unit derived from alkyl acrylates, alkyl methacrylate exceeds 90 mole % these polymer when grafted will act as pinning materials for polymer block domains such as those derived from alkyl methacrylate. Conversely, if the total amount of repeat units derived from a styrenic material exceeds 90 mole % when grated these will act as pinning materials for styrenic domains. Also, if the amount of each type of repeat unit is roughly equal (i.e. 45-55 mole % total styrenic, 45-55 mole % total alkyl acrylate or methacrylate) the grafted films will act as neutral layers.

Another aspect of this invention is a novel composition where the polymer is comprised of main chain repeat units containing triphenylmethyl chalcogenide moieties having structure (I), an end chain group units containing triphenylmethyl chalcogenide moieties having structure (II) or mixtures of these two types of units and a solvent. As previously discussed such material when grafted on a substrate may act as a pinning material, a neutral material depending on the molar proportions of each type of repeat unit compared to the polarity of the block domains of a block copolymer film overcoated the grafted polymer film.

The polymer of this invention containing either pendant triphenymethyl chalcogenide of structure (I) can be prepared by a variety of ways by which alkene containing monomers can be polymerized randomly (such as nitroxide mediated polymerization, cationic, anionic condensation chain polymerization and the like) but generally they are prepared by radical polymerization such as the ones initiated by free radical initiators such as AIBN (azobisisobutyronitrile), benzoyl peroxide or other standard thermal radical initiators. The novel polymers may also be prepared by polymer modification of alkyl vinyl, alkyl acrylate, alkyl methacrylate, alkyloxy vinyl or N-alkyl acrylamide, aryl vinyl polymer or copolymer of these having pendant reactive group or end groups such as $CH_2OH$, or $CH_2L$, where L is a leaving group such as Cl, Br, I, or a sulfonate leaving group such as tosylate (Ts). For instance, novel polymer comprised of units of structure (I) where Y is O can be prepared by reaction of a precursor polymer with a $CH_2OH$ pendant group reacting with a halo trityl derivative compound having structure (VIIa) where Hal=Cl, Br or I. Novel polymer comprised of units of structure (I) or (II) where Y is O can be prepared by reaction of a polymers or copolymer having pendant $CH_2L$ groups (i.e ~$CH_2$—Cl, $CH_2$—Br, $CH_2OTs$ and the like) with compounds having structure (VIIb). Similarly, polymers comprised of structure (I) where Y=Se, Te may be made by reaction of a polymer with a pendant $CH_2OH$ group with a compound of structure (VIIc) in the presence of a lewis acid such as $AlBr_3$ or $AlCl_3$ in methylene chloride.

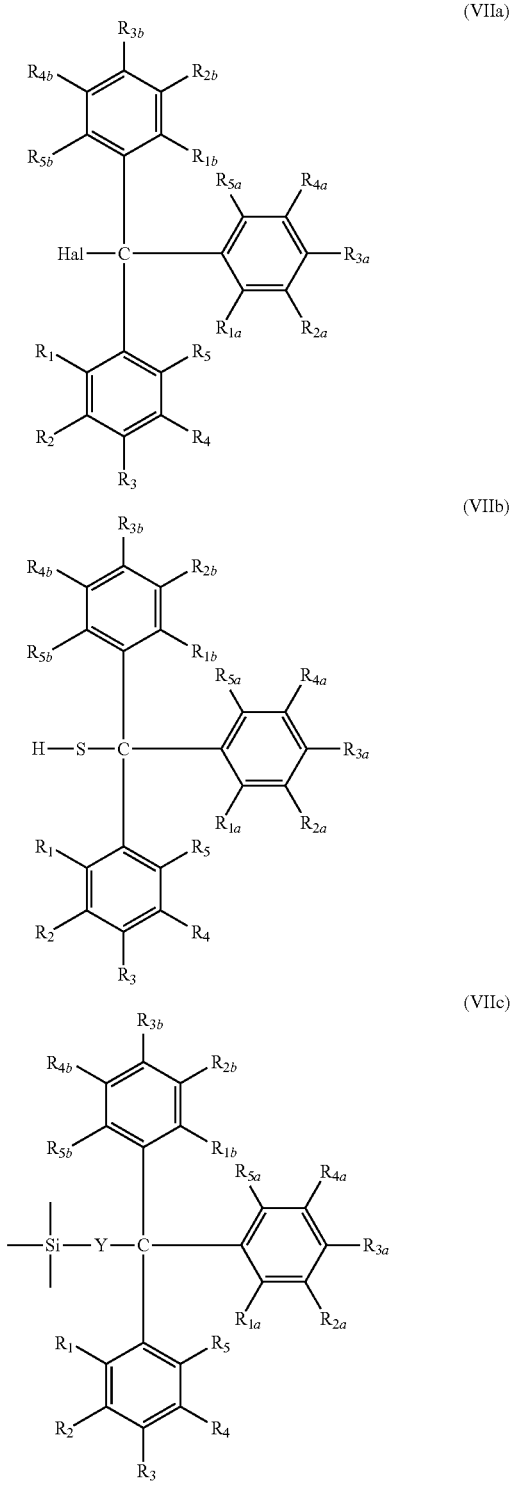

(VIIa)

(VIIb)

(VIIc)

Similarly, novel polymer containing end group having structure (II) with Y═S may be prepared by suitable end capping reaction of alkyl vinyl, alkyl acrylate, alkyl methacrylate, alkyloxy vinyl or N-alkyl acrylamide, aryl vinyl polymer or copolymer of these containing reactive $CH_2L$ group (i.e. CH2OTs and the like) with compounds having structure VIIb. As an example a styrene may be polymerized anionic ally and the reactive anionic end cap is reacted with an oxirane such as ethylene oxide to produce a hydroxy end cap. In turn this hydroxy end cap is reacted with a compound of structure (VIIb) here Y is S, consequently producing an end group of structure (II) where Y is S. Alternatively, this hydroxy capped styrene could be reacted with a compound of structure (VIIa) to produce a material where in structure (II) Y is O. Similarly, end capping with structures (II) where Y is Se or Te could be done be using a polymer containing a —$CH_2OH$ end group which is coupled with a compound of structure (VIIc) where Y is Se or Te.

Solvents suitable for the novel composition are ones which will dissolve a polymer containing (I) or (II) alone, or in a composition with other components, Suitable solvents include as non-limiting examples a glycol ether derivative such as ethyl cellosolve, methyl cellosolve, propylene glycol monomethyl ether (PGME), diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate (PGMEA); carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate (EL), ethyl glycolate, and ethyl-3-hydroxy propionate; a ketone ester such as methyl pyruvate or ethyl pyruvate; an alkoxycarboxylic acid ester such as methyl 3-m ethoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; a ketal or acetal like 1,3 dioxalane and diethoxypropane; lactones such as gamma-butyrolactone (GBL); an amide derivative such as dimethylacetamide or dimethylformamide, anisole, and mixtures thereof. The composition may further comprise additives such as surfactants.

The wt % of n structure (1) in a solvent may range from 0.1 to 10 wt %. In another embodiment the range may be from 0.5 to 10 wt %. In yet another embodiment the range may be 0.5 to 5 wt %. In yet another more specific embodiment the range may be 0.8 to 1.2 wt %.

The novel composition may be comprised of optional additional additives including leveling agents, surfactants. Photoacid generators, thermal acid generators, bases, and the like may also be employed as optional additives, but these are not needed for achieving grafting.

Another aspect of this invention is to employ the novel composition in a process where it forms a grafted film on a substrate which is comprised of steps a) b) and c) as follows: a) coating a film on a substrate using the novel composition where the polymer is one where in structure (I) or (II) Y is O, S, Se or Te, b) baking the film at a temperature between 80 to 300° C., c) washing the film with a solvent to remove un-grafted polymer leaving behind the grafted film. The solvent employed in step c) to remove ungrafted solvent or in other subsequently described steps where ungrafted polymer is required to be removed may be selected from ones, as previously described, suitable for dissolving the novel polymer. In a more specific embodiment of this process in the polymer Y is O or S.

Substrates may be selected from semiconductors, metals or metal oxides. Non limiting Examples of suitable semiconductors are Silicon, Germanium, Aluminum phosphide, Aluminum arsenide, Gallium arsenide, Gallium nitride. Non limiting examples of metals are Copper, Aluminum, Zirconium, Hafnium, Titanium, Tungsten, and Molybdenum. Non limiting examples of metal oxides are Copper oxide, Aluminum oxide, Zirconium oxide, Hafnium oxide, Titanium oxide, Tungsten oxide, and Molybdenum oxide.

Another aspect of this invention is to employ the novel composition in a process for self-assembly comprised of steps a) to f) as follows:
a) coating a film on a substrate using the novel composition where the polymer is one, as previously described, where in structure (I) or (II) Y is O, S, Se or Te, b) baking the film at a temperature between 80 to 300° C., c) washing the film with a solvent to remove un-grafted polymer leaving behind the grafted film, d) coating a film of a block copolymer on the grafted film, e) applying a solvent bake to remove solvent from coasting step d), f) applying an annealing bake to enable self-assembly of the block copolymer. A more specific embodiment of this process is where in the polymer Y is O or S.

Another inventive process is forming a grafted coating film selectively onto metal patterns on a patterned substrate comprised of steps a) b) and c) as follows: a) coating a film on the patterned substrate using the composition using the novel composition where the polymer is one where in structure (I) or (II) Y is S, Se, or Te, b) baking the film at a temperature between 80 to 300° C., c) washing the film with a solvent to remove un-grafted polymer leaving behind the grafted film on the metal pattern. A more specific embodiment of this novel grafting process is the one where the metal patterns are Cu metal patterns. Another further embodiment of this novel process is where in step b) the temperature is between 100 and 250° C. Another more specific embodiment of this inventive process is where the patterned substrate also contains other patterns, such as Si semiconductor patterns. Another mores specific embodiment of this process is where in the polymer Y is S.

Another inventive process is a process for directed self-assembly on a patterned substrate containing metal patterns comprised of steps a) to f) as follows: a) coating a film on the patterned substrate using the novel composition where the polymer is one where in structure (I) or (II) Y is S, Se, or Te,
b) baking the film at a temperature between 80 to 300° C.,
c) washing the film with a solvent to remove un-grafted polymer leaving behind the grafted film only on the metal patterns, d) coating a film of a block copolymer on the grafted film,
e) applying a solvent bake to remove solvent from coasting step d),
f) applying an annealing bake between 200 and 300° C. to enable self-assembly of the block copolymer. A more specific embodiment of this directed self-assembly process is where in step b) the baking temperature is 100 to 250. Another embodiment of this directed self-assembly process is where the metal patterns are Cu metal patterns. In yet another embodiment of this directed self-assembly process the patterned substrate also contains other patterns, such as Si semiconductor patterns.

Another inventive process is to use the novel composition for directed self-assembly applications where a grafted coating film selectively onto one desired pattern surface but not other surface to generate alternating prepattern for chemoepitaxy or graphoepitaxy directed self-assembly applications. In this directed self-assembly processes, the composition of monomers in the grafted polymer film compared to the composition of the block copolymer which is coated onto it predicate whether the grafted film will act as a pinning or neutral film. Specifically, if the grafted polymer predominantly (90-100 mole %) consists of repeat units which chemically resemble one of the block domains in the block copolymer then this grafted polymer film will act as a pinning site for this block domain in directed self-assembly. A non-limiting example would be a grafted film produced from the novel polymer film of this invention which has predominantly styrene repeat units and will act as a pinning site for the styrene domains of poly(styrene-b-methacrylate) film Such a material could for instance be a homopolymer containing repeat units having structure (V), of a copolymer which would consist primary of styrenic units having structure (V) and other styrenic repeat units.

Conversely, another non-limiting example would be a grafted film derived from the novel polymer film of this invention which was predominantly comprised (i.e. >90 mole %) of polar moieties which may act as pinning sites for corresponding domains in overlying block copolymers during self-assembly. For instance a novel grafted polymer comprised of repeat units having a similar polarity to methyl methacrylate which can act as a pinning layer for methyl methacrylate domains of a poly styrene methyl methacrylate block copolymer during self-assembly during step d) to f). p(S-b-MMA). for an overlying block copolymer during self-assembly.

Finally, in this novel process the grafted film arising from the novel polymer may also act as a neutral layer if the proportion of the units derived from the polar repeat units and the non-polar repeat units are roughly equal, as previously discussed.

The process of directed self-assembly with the novel grated material allows for further improvement in resolution or CD uniformity of the existing pattern made by conventional lithographic techniques, such as UV lithography (450 nm to 10 nm), immersion lithography, EUV or e-beam.

In the above processes of self-assembly or directed self-assembly comprised of steps a) to f), the block copolymer film coated in step d) may be coated from diblock copolymer solution where the block copolymer contains a high etch resistant block and a highly etchable block would be the block copolymer poly(styrene-b-methylmethacrylate). Typically, the block copolymers suitable for being used in these inventions have a weight-averaged molecular weight ($M_w$) in the range of about 3,000 to about 500,000 g/mol and a number averaged molecular weight ($M_n$) of about 1,000 to about 400,000 and a polydispersity ($M_w/M_n$) (PD) of about 1.01 to about 6, or 1.01 to about 2 or 1.01 to about 1.5. Other specific non-limiting examples of other diblock copolymers that may be are poly(styrene-b-methyl methacrylate), poly(styrene-b-butadiene), poly(styrene-b-isoprene), poly(styrene-b-methyl methacrylate), poly(styrene-b-alkenyl aromatics), poly(styrene-b-(ethylene-propylene)), poly(styrene-b-t-butyl (meth)acrylate), poly(styrene-b-tetrahydrofuran), poly(styrene-b-ethyleneoxide), poly(styrene-b-dimethylsiloxane), poly(methyl methacrylate-b-dimethylsiloxane), poly(styrene-b-carbonate), poly(styrene-b-lacide), and poly(methylmethacrylate-b-4-vinylpyridine)). All these polymeric materials share in common the presence of at least one block which has repeat units resistant to plasma etching techniques typically employed in manufacturing IC devices, and at least one block which etches rapidly under these same conditions or that can be removed by chemical or photochemical processes. This allows for the directed self-assembled polymer to pattern transfer onto the substrate to affect via formation. Solvent suitable to dissolve these block copolymers are spin casting solvent as described above as suitable for dissolving the novel polymer.

The block copolymer for use in directed self-assembly in conjunction with the novel grafted polymer film produced steps a) to f) composition can be any block copolymers which can form domains through self-assembly. The microdomains are formed by blocks of the same type which tend to self-associate. Typically, block copolymer employed for this purpose are polymers in which the repeat units derived from monomers are arranged in blocks which are different compositionally, structurally or both and are capable of phase separating and forming domains. The blocks have differing properties which can be used to remove one block while keeping the other block intact on the surface, thus providing a pattern on the surface. Thus, the block may be selectively removed by plasma etching, solvent etching, developer etching using aqueous alkaline solution, etc. In block copolymers based on organic monomers, one block can be made from polyolefinic monomers including polydienes, polyethers including poly(alkylene oxides) such as poly(ethylene oxide), poly(propylene oxide), poly(butylene oxide) or mixtures thereof; and, the other block can be made from different monomers including poly((meth)acrylates), polystyrenes, polyesters, polyorganosiloxanes, polyorganogermanes, and or mixtures thereof. These blocks in a polymer chain can each comprise one or more repeat units derived from monomers. Depending on the type of pattern needed and methods used different types of block copolymers may be used. For instance, these may consist of diblock copolymers, triblock copolymers, terpolymers, or multi-block copolymers. The blocks of these block copolymers may themselves consist of homopolymers or copolymers. Block copolymers of different types may also be employed for self-assembly, such as dendritic block copolymers, hyperbranched block copolymers, graft block copolymers, organic diblock copolymers, organic multiblock copolymers, linear block copolymers, star block copolymers amphiphilic inorganic block copolymers, amphiphilic organic block copolymers or a mixture consisting of at least block copolymers of different types.

The blocks of organic block copolymer may comprise repeat units derived from monomers such as $C_{2-30}$ olefins, (meth)acrylate monomers derived from $C_{1-30}$ alcohols, inorganic-containing monomers including those based on Si, Ge, Ti, Fe, Al. Monomers based on $C_{2-30}$ olefins can make up a block of high etch resistance alone or do so in combination with one other olefinic monomer. Specific example of olefinic monomers of this type are ethylene, propylene, 1-butene, 1,3-butadiene, isoprene, dihydropyran, norbornene, maleic anhydride, styrene, 4-hydroxy styrene, 4-acetoxy styrene, 4-methylstyrene, alpha-methylstyrene or mixtures thereof. Examples of highly etchable units can be derived from (meth)acrylate monomers such as (meth)acrylate, methyl (meth)acrylate, ethyl (meth)acrylate, n-propyl (meth)acrylate, isopropyl (meth)acrylate, n-butyl (meth) acrylate, isobutyl (meth)acrylate, n-pentyl (meth)acrylate, isopentyl (meth)acrylate, neopentyl (meth)acrylate, n-hexyl (meth)acrylate, cyclohexyl (meth)acrylate, isobornyl (meth) acrylate, hydroxyethyl (meth)acrylate or mixtures thereof.

An illustrative example of a block copolymer containing one type of high etch resistant repeat unit would be a polystyrene block containing only repeat units derived from styrene and another type of highly etchable polymethylmethacrylate block containing only repeat units derived from methylmethacrylate. These together would form the block copolymer poly(styrene-b-methylmethacrylate), where b refers to block.

Specific non-limiting examples of block copolymers that are useful for graphoepitaxy, chemoepitaxy or pinned chemoepitaxy as used for directed self-assembly on a patterned neutral layer, are poly(styrene-b-vinyl pyridine), poly (styrene-b-butadiene), poly(styrene-b-isoprene), poly(styrene-b-methyl methacrylate), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl (meth)acrylate), poly(methyl methacrylate-b-t-butyl methacrylate), poly(ethylene oxide-b-propylene oxide), poly(styrene-b-tetrahydrofuran), poly(styrene-b-isoprene-b-ethylene oxide), poly(styrene-b-dimethylsiloxane), poly(methyl methacrylate-b-dimethylsiloxane), or a combination comprising at least one of the above described block copolymers. All these polymeric materials share in common the presence of at least one block which is rich in repeat units resistant to etching techniques typically employed in manufacturing IC devices and at least one block which etches rapidly under these same conditions. This allows for the directed self-assembled polymer to pattern transfer onto the substrate to affect either pattern rectification or pattern multiplication.

Typically, the block copolymers employed for the directed self-assembly such as in graphoepitaxy, chemoepitaxy or pinned chemoepitaxy have a weight-averaged molecular weight ($M_w$) in the range of about 3,000 to about 500,000 g/mol and a number averaged molecular weight ($M_n$) of about 1,000 to about 60,000 and a polydispersity ($M_w/M_n$) of about 1.01 to about 6, or 1.01 to about 2 or 1.01 to about 1.5. Molecular weight, both $M_w$ and $M_n$, can be determined by, for example, gel permeation chromatography using a universal calibration method, calibrated to polystyrene standards. This ensures that the polymer blocks have enough mobility to undergo self-assembly when applied to a given surface either spontaneously, or by using a purely thermal treatment, or through a thermal process which is assisted by the absorption of solvent vapor into the polymer framework to increase flow of segments enabling self-assembly to occur.

Solvents suitable for dissolving block copolymers for forming a film are the same as described for dissolving the novel polymers containing triphenylmethyl chalcogenide moieties.

The block copolymer composition can comprise additional components and/or additives selected from the group consisting of: inorganic-containing polymers; additives including small molecules, inorganic-containing molecules, surfactants, photoacid generators, thermal acid generators, quenchers, hardeners, cross-linkers, chain extenders, and the like; and combinations comprising at least one of the foregoing, wherein one or more of the additional components and/or additives co-assemble with the block copolymer to form the block copolymer assembly.

The block copolymer composition is applied to a pattern of the novel neutral layer which has been defined on a surface by conventional lithography, where the neutral surface is a cross-linked coating formed from the novel composition. Upon application and solvent removal, the block copolymer then undergoes self-assembly directed by the specific pattern formed by conventional lithographic processing over the neutral layer through either actual topographical features or a patterned chemical difference of the substrate surface created by conventional lithographic process. Either pattern rectification maintaining the same resolution is achieved and/or pattern multiplication may also be achieved if multiple phase boundaries are formed between the features defined with conventional lithography, depending on the relative pitch of the pattern versus the microphase separation distance after standard IC processing to pattern transfer.

The application of the block copolymer by spinning techniques (including spin drying) can suffice to form the self-directed block copolymer assembly. Other methods of self-directed domain formation can occur during applying, baking, annealing, or during a combination of one or more of these operations. In this way, an oriented block copolymer assembly is prepared by the above method, having microphase-separated domains that comprise cylindrical microdomains oriented perpendicular to the neutral surface, or that comprise lamellar domains oriented perpendicular to the neutral surface. Generally, the microphase-separated domains are lamellar domains oriented perpendicular to the neutral surface, which provide parallel line/space patterns in the block copolymer assembly. The domains, so oriented, are desirably thermally stable under further processing conditions. Thus, after coating a layer of a block copolymer assembly including a useful diblock copolymer such as, for example, poly(styrene-b-methyl methacrylate), and optionally baking and/or annealing, the domains of the block copolymer will form on and remain perpendicular to the neutral surface, giving highly resistant and highly etchable regions on the surface of the substrate, which can be further pattern transferred in the substrate layers. The directed self-assembled block copolymer pattern is transferred into the underlying substrate using known techniques. In one example wet or plasma etching could be used with optional UV exposure. Wet etching could be with acetic acid. Standard plasma etch process, such as a plasma comprising oxygen may be used; additionally argon, carbon monoxide, carbon dioxide, $CF_4$, $CHF_3$, may be present in the plasma.

The above processes describe novel processes that can be practiced. The process can use the novel pinning or neutral layer composition of the present invention.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

The molecular weight of the polymers was measured with a Gel Permeation Chromatograph. All chemicals were obtained from the Sigma-Aldrich Corporation (St. Louis, Mo.) or Fisher Scientific International, Inc. (Hampton, N.H.). AZ® EBR 70/30EBR and AZEMBLY™ EXP PME-120 coating 35 were obtained from EMD Performance Materials Corp. 70 Meister Ave, Somerville, N.J. 08876.

Synthesis Example 1: Synthesis of Polystyrene Endcapped with $CH_2CH_2OH$ (VIII)

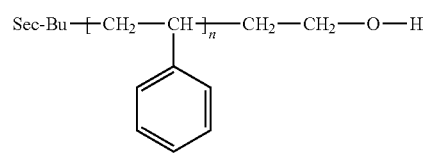

(VIII)

A single neck 1L glass reactor was equipped with a septum adapter to facilitate application of $N_2$ and vacuum to the reactor. The reactor was dried using heat-gun under dynamic vacuum and filled with dry $N_2$. About 600 mL of anhydrous cyclohexane was transferred into the reactor using a stainless steel cannula under $N_2$. Subsequently, 110 mL (99.66 gram) of styrene (degassed and stored under $N_2$) was added into the reactor using $N_2$ purged syringe. Sec-BuLi (1.4M) was added drop-by-drop to quench the impurity in the monomer solution. The titration was performed until a faint honey color persisted in the solution. Immediately, after the achievement of a persistent color, 14.5 mL, 0.020 mole of sec-BuLi (1.4M) was added into the reaction mixture using a syringe. The solution turned orange in color. The reaction was kept in a water bath at 45° C. for 4 h. The living polystyryllithium anions were then end-capped by adding to the reaction mixture, using a cannula, 2 mL of purified ethylene oxide (EO) which had been distilled over a small amount of sec-BuLi. The orange color of the living polystyryllithium disappeared immediately upon addition of EO. Extreme caution should be observed while adding low boiling monomer solution into the reactor kept at 45° C. After the addition, the hot water bath was removed and the end-capping reaction was continued for 2 h at 25° C. The reaction mixture was terminated by adding 0.5 ml of 1M HCl and an inlet $N_2$ bubbling tube was inserted. Nitrogen was then bubbled for 15 min into the reaction mixture to expel the remaining excess EO into an outlet cannula via the septum into a flask containing NaOH solution. The reaction mixture was then diluted with 30 mL of tetrahydrofuran (THF) and precipitated into an excess ethanol or ethanol with 10% water solution. The precipitated polymer was washed with ethanol until the filtrate achieved a neutral pH and the polymer was dried under vacuum at 55° C. over 10 h. Yield 100%. Mw=6058 and =4,893 g/mol.

Synthesis Example 2: Synthesis of mmt-SH (mmt=4-Monomethoxytrityl) (IX)

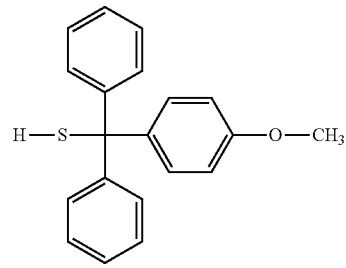

(IX)

A 3 L flask was charge with 60 g of sodium hydrosulfide hydrate dissolved in a mixture of 700 g acetone/700 g water and this solution was degassed to remove air by bubbling into it $N_2$. To this flask was then added 60 g of 4-monomethoxytrityl chloride dissolved in 250 g of warm acetone. The mixture was stirred at room temperature for 2 hrs. The formed mmt-SH solid was isolated by filtering and washed thoroughly by DI water and finally dried in a room temperature (rt) vacuum oven until constant weight to obtain 52 g mmt-SH. Proton NMR confirmed the structure (in $CDCl_3$, 14 phenyl H at 6.8-7.4 ppm; 3H in —$OCH_3$ at 3.8 ppm and 1H in SH at 3.15 ppm)

Synthesis Example 3: Synthesis of Polystyrene Endcapped with CH$_2$CH$_2$—S-mmt (mmt=4-Monomethoxytrityl) (X)

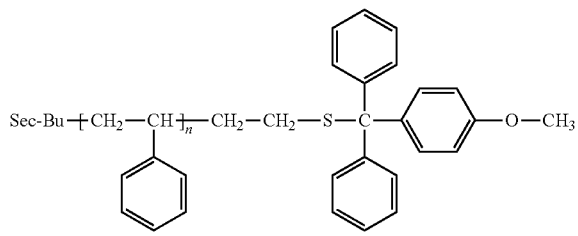

(X)

Under nitrogen gas protection, 100.3 g of the polymer made in example 1 was dissolved in 460 g of methylene chloride and charged into a 3 L flask. To this was added 30 g of p-toluenesulfonyl chloride (TsCl) dissolved in 240 g of methylene chloride. Under stirring, 18.3 g of triethylamine was then added in a few portions. After the addition the reaction mixture was stirred at room temperature for 24 hrs. After this time, the solution was slowly poured into methanol with vigorous stirring. The polymer was isolated by filtering. The polymer was further purified by dissolving it in THF and precipitating it in water, dissolving it again, and finally precipitating in methanol. The purified polymer was dried in 45° C. vacuum oven until constant weight to obtain 93 g white polymer. Proton NMR showed that OH end-group was successfully converted to OTs.

Under nitrogen protection 12.8 g of mmt-SH made in Synthesis Example 2 was dissolved in 62 g of THF and 33 g of 1M potassium tert-butoxide in THF was added to this solution. After stirring at rt for about 10 min, 93 g of the polymer made above dissolved in 328 g of THF was added to this solution. This reaction mixture was stirred at rt for 24 hrs. The solution was poured into 4L of 1:1 (V/V) petroleum ether/isopropanol with vigorous agitation. The precipitated polymer was isolated by filtering. This polymer was further purified by dissolving it in THF and precipitating it again in water, and finally in methanol. The purified polymer was dried in 45° C. vacuum oven until constant weight to obtain 77 g white polymer. Proton NMR showed that OTs end-group was successfully converted to S-mmt. Mw=5959 and Mn=4738 g/mol.

Synthesis Example 4: Synthesis of Polymer with the Following Structure (XI)

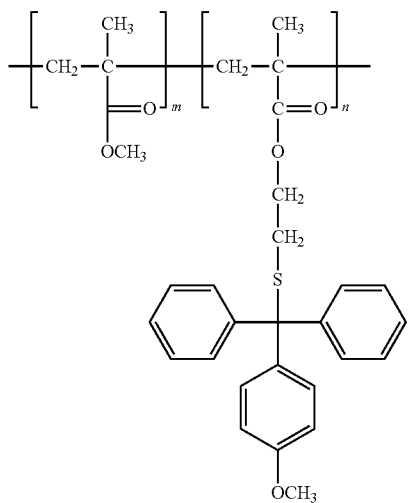

(XI)

In a flask equipped with a magnetic bar and a cold water condenser, 0.59 g of 2-chloroethyl methacrylate, 0.6 g of AIBN and 19.6 g of methyl methacrylate were dissolved in 45 g of methyl ethyl ketone and the solution was purged with nitrogen gas for 30 min. The flask was immersed in an 80° C. oil bath. The reaction was then kept at this temperature for 5 hrs. After cooling, the polymer solution was slowly poured into methanol with vigorous agitation. The polymer obtained was isolated by filtering and dried in a 45° C. vacuum oven until constant weight to obtain 15 g of white polymer.

Under the protection of a nitrogen atmosphere, 0.7 g of mmt-SH made in Synthesis Example 2 was dissolved in 3 g of THF, and then 1.78 g of 1M potassium tert-butoxide in THF was added to this solution. After stirring at rt for about 10 min, 8 g of the polymer as made above was dissolved in 20 g of THF and added to this solution. The resultant reaction mixture was stirred at 50° C. for 24 hrs. The solution was then cooled and poured into 1:1 (V/V) petroleum ether/isopropanol with vigorous agitation. The formed polymer was isolated by filtering. The polymer was purified by dissolving in THF and precipitating it into water and finally precipitating it in methanol again. The purified polymer was dried in 45° C. vacuum oven until constant weight was achieved to obtain 6.8 g white polymer. Proton NMR showed that the polymer contained desired S-mmt side groups. Mw=16821 and Mn=10544 g/mol.

Synthesis Example 5: Synthesis of Polymer with the Following Structure (XIII)

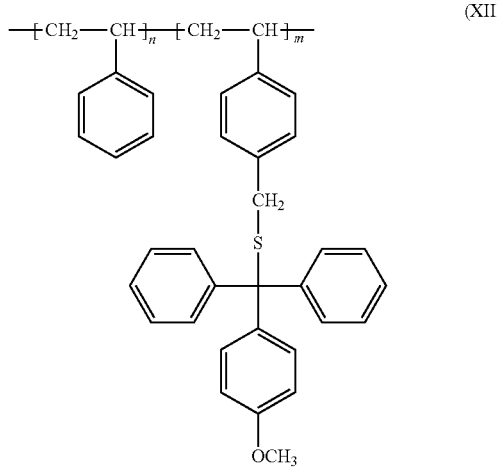

(XIII)

In a flask equipped with a magnetic stirring bar and a cold water condenser, 0.66 g of 4-vinylbenzyl chloride, 1.0 g of AIBN and 20.4 g of styrene were dissolved in 45 g of methyl ethyl ketone and the solution was purged with nitrogen gas for 30 min. The flask was the immersed in a 80° C. oil bath. The reaction was kept at this temperature for 5 hrs. After cooling, the polymer solution was slowly poured into methanol with vigorous agitation. The polymer obtained was isolated by filtering and dried in a 45° C. vacuum oven until constant weight to obtain 11 g of white polymer.

Under nitrogen protection 0.71 g of mmt-SH made in Synthesis Example 2 was dissolved in 3 g of THF and 1.78 g of 1M potassium tert-butoxide in THF was added. After stirring at rt for about 10 min, 8 g of the polymer made above issolved in 20 g of THF was added. The reaction mixture was stirred at 50° C. for 24 hrs. The solution was then cooled and poured into 1:1 (V/V) petroleum ether/isopropanol with vigorous agitation. The formed polymer was isolated by filtering. The polymer was purified by dissolving it in THF and precipitating in water and finally in methanol again. The purified polymer was dried in 45° C. vacuum oven until constant weight to obtain 5.3 g white polymer. Proton NMR showed that the polymer contained desired S-mmt side groups. Mw=6128 and Mn=4357 g/mol.

Synthesis Example 6: Synthesis of Polymer with the Following Structure (XIV)

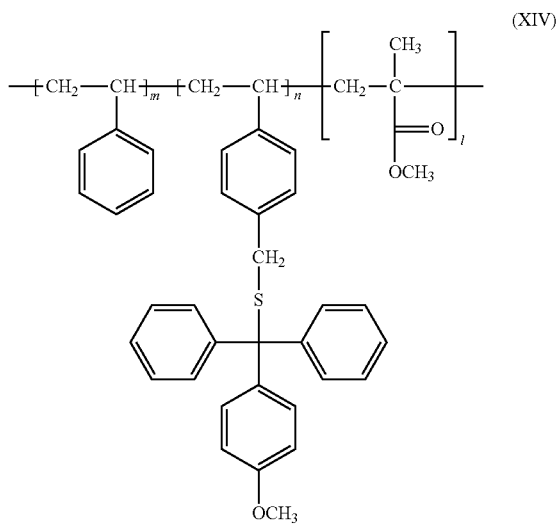

In a flask with a magnetic stirring bar and a cold water condenser, 0.62 g of 4-vinylbenzyl chloride, 0.657 g of AIBN, 10 g of styrene and 10 g of methyl methacrylate were dissolved in 45 g of methyl ethyl ketone and the solution was purged with nitrogen gas for 30 min. The flask was then immersed in a 80° C. oil bath. The reaction was kept at this temperature for 6 hrs. After cooling the polymer solution was slowly poured into methanol with vigorous agitation. The polymer obtained was isolated by filtering and dried in a 45° C. vacuum oven until constant weight to obtain 11 g of white polymer.

Under the protection of a nitrogen atmosphere, 1.05 g of mmt-SH made in Synthesis Example 2 was dissolved in 4 g of THF, and 2.62 g of 1M potassium tert-butoxide in THF was added. After stirring at rt for about 10 min, 11 g of polymer made above dissolved in 25 g of THF was added. The reaction mixture was stirred at 50° C. for 24 hrs. The solution was cooled and poured into 1:1 (V/V) petroleum ether/isopropanol with vigorous agitation. The formed polymer was isolated by filtering. The polymer was purified by dissolving it in THF and precipitating in water and finally in methanol again. The purified polymer was dried in 45° C. vacuum oven until constant weight to obtain 5.3 g white polymer. Proton NMR showed that the polymer contained desired S-mmt side groups. Mw=10550 g/mol and Mn=7507 g/mol.

Synthesis Example 7: Synthesis of PS—CH$_2$CH$_2$ODMT (DMT=4,4'-Dimethoxytrityl) (XV)

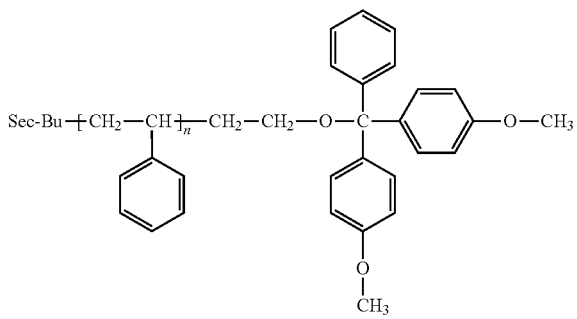

In a flask, 5.1 g of PS—CH$_2$CH$_2$OH (Mn: 11110 g/mol and PDI: 1.02) made using the same procedure described in Synthesis Example 1 was dissolved in 14 g of THF. To this solution was added under nitrogen 0.47 g of 4,4'-dimethoxytrityl chloride dissolved in 2 g of THF, followed by 0.2 g of triethylamine. After the reaction mixture was stirred at room temperature for 19 hrs, the solution was slowly poured into methanol with vigorous stirring. The polymer was isolated by filtering. The polymer was purified by dissolving it in THF and precipitating in water and finally in methanol again. The purified polymer was dried in 45° C. vacuum oven until constant weight to obtain 4.7 g white polymer. Proton NMR showed that OH end-group was successfully converted to O-DMT endgroup. GPC showed the polymer had Mw=11108 g/mol and PDI=1.02.

Testing Example 1 (Polymer Stability Test)

Polystyrene endcapped with CH$_2$CH$_2$SH (PS—CH$_2$CH$_2$SH) bought from Polymer Source Inc. (124 Avro Street, Dorval (Montreal), Quebec H9P 2X8, Canada) was analyzed by GPC to show a Mw of 15529 g/mol and a Mn of 13405 g/mol with a single peak. This polymer was stored in −20° C. freezer for 1 month and analyzed again by GPC that showed a Mw of 18530 g/mol and a Mn of 14405 g/mol with a bimodal trace. This clearly showed that this polymer's molecular increased during storage probably due to air-oxidized S—S coupling.

Testing Example 2 (Polymer Stability Test)

First polymer PS—CH$_2$CH$_2$SH used in Test Example 1 was modified using the following procedure.

0.60 g of PS—CH$_2$CH$_2$SH used in test Example 1 was dissolved in 5.4 g of methylene chloride. To this was added under nitrogen gas protection 4 g of 5 wt % mmt-Cl (4-monomethoxytrityl chloride) solution in methylene chloride, followed by 1.5 g of 5 wt % solution of triethylamine in methylene chloride. After the reaction mixture was stirred at room temperature for 24 hrs, the solution was slowly poured into methanol with vigorous stirring. The polymer was isolated by filtering. The polymer was purified by precipitating in water and finally in methanol again. The purified polymer was dried in 45° C. vacuum oven until constant weight to obtain 0.3 g white polymer. Proton NMR showed that SH endgroup was successfully converted to S-mmt endgroup. The polymer was analyzed by GPC immediately and the polymer sample was stored at room temperature for 1 month and analyzed again by GPC. GPC comparison for the fresh and aged sample show no change at all. Fresh sample: Mw=14077 and Mn=12823. Aged sample: Mw=13985 and Mn=12673 g/mol.

Testing Example 3 (Selective Grafting on Different Surfaces)

A formulation was made consisting of 1 wt % of the material of Synthesis Example 6 in PGMEA. This formulation was individually coated on Cu or Si coupon wafers at 1500 rpm, and baked at 120° C., 140° C., 170° C., or 200° C. for 1 min respectively. The wafers were then each rinsed with AZ® EBR 70/30EBR (EBR 7030) for 30 sec. and baked at 110° C. for 1 min. The Cu coupon and a Si coupon wafers were also coated at 1500 rpm and baked at 120° C. for 1 min baked but without an EBR rinse. The water contact angle (CA) of all these wafers are reported in Table 1.

TABLE 1

|  | CA—Cu | CA—Si |
| --- | --- | --- |
| 120° C./1M bake without EBR rinse | 75.3 | 75.8 |
| 120° C./1M bake after EBR rinse | 67.1 | 18.1 |
| 140° C./1M bake after EBR rinse | 74.6 | 18.5 |
| 170° C./1M bake after EBR rinse | 76.8 | 50.6 |
| 200° C./1M bake after EBR rinse | 76.9 | 59.7 |

Testing Example 4 (Selective Grafting on Different Surfaces)

A formulation was made consisting of 1 wt % of the material of Synthesis Example 6 in PGMEA. This formulation was coated on Cu or Si coupon wafers at 1500 rpm, and baked at 140° C. for 1 min. These wafers were then rinsed with EBR7030 for 30 sec. and baked at 110° C. for 1 min. These wafers were then coated a lamellar type of block copolymer (BCP) solution AZEMBLY™ EXP PME-120 coating 35 (Lo=28 nm, film thickness is 35 nm at 1500 rpm) on these two Cu or Si grafted coupon wafers at 1500 rpm, and annealed at 250° C. for two min. The annealed films on both coupon wafers were examined by e-beam by using a NanoSEM. Finger print images were only be seen on the annealed BCP coated Cu coupon wafer, there were no finger print images observed in the annealed BCP films on the Si coupon wafer. FIG. 6 shows the BCP self assembled finger print e-beam images seen on the coated an annealed Cu coupon wafer on which was grafted the material of Synthesis Example 6. The field of view for this Figure is 0.5×0.5 µm. X-ray photoelectron spectroscopy (XPS) was done of the bare copper wafer and the copper wafer coated with the material of Example 6 are shown in FIG. 7a (XPS of copper wafer) and FIG. 7b(XPS of copper wafer coated with material of Example 6). These XPS spectra clearly showed the increased carbon content of the surface grafted with the material of Synthesis Example 6 indicative of the successful grafting of this material on copper.

The invention claimed is:

1. A non-aqueous, graftable coating composition comprised of a homogenous solution of a polymer and a spin casting organic solvent, wherein
the composition does not contain acidic compounds, coloring particles, pigments or dyes, and
the polymer has a linear polymer chain structure which is comprised of repeat units derived from monomers containing a single polymerizable olefinic carbon double bond, and
the polymer contains at least one triarylmethyl chalcogenide containing moiety which is selected from the group consisting of repeat units having structure (I), an end chain group unit of structure (II), and mixtures thereof, and the polymer does not contain any repeat units or end groups containing water ionizable groups, ionic groups, free thiol groups, or free hydroxy groups,

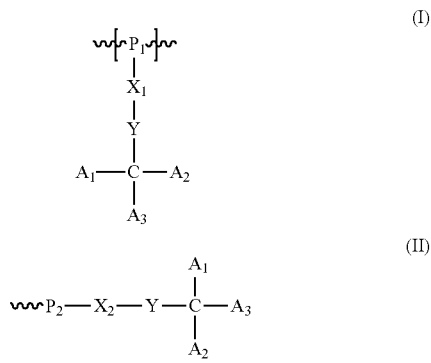

where $A_1$, $A_2$, and $A_3$ are independently an aryl or a substituted aryl, and Y is a chalcogen selected from S, Se or Te, and $X_1$ and $X_2$ are individually selected organic spacers, and $P_1$ is an organic polymer repeat unit moiety derived from a monomer containing a single polymerizable olefinic carbon double bond, and $P_2$ is an end group moiety derived from a monomer containing a single polymerizable olefinic carbon double bond, and 〜〜 represents a direct valence bond to the linear polymer.

2. The composition of claim 1 where in the polymer at least one of $A_1$, $A_2$, or $A_3$ is a substituted aryl substituted with an alkyloxy moiety.

3. The composition of claim 1 where the polymer is a random copolymer further comprised of repeat units derived from monomers containing a single polymerizable carbon double bond which do not contain a pendant triarylmethyl chalcogenide.

4. The composition of claim 1 where in the polymer the organic spacers $X_1$, and $X_2$ are independently selected from an alkylene, fluoroalkylene, an oxyalkylene, oxyfluoroalkylene, an arylene, a fluoroarylene, an oxyarylene, a carbonylalkylene, a carbonyloxyalkylene, an oxycarbonyloxyalkylene, or a carbonyl —N(R')— alkylene, where R' is hydrogen, an alkyl, or an aryl.

5. The composition of claim 1 where in the polymer the repeat units (I) have structure (Ia), and the end chain group units (II) have structure (IIa), (Ia)

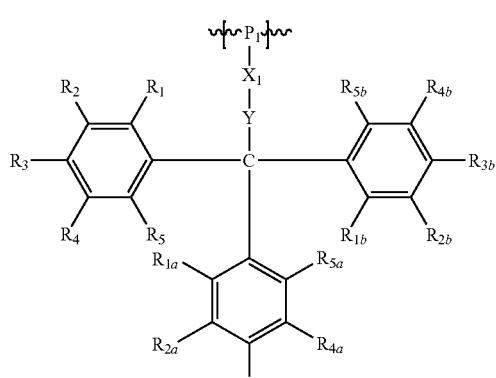

(IIa)

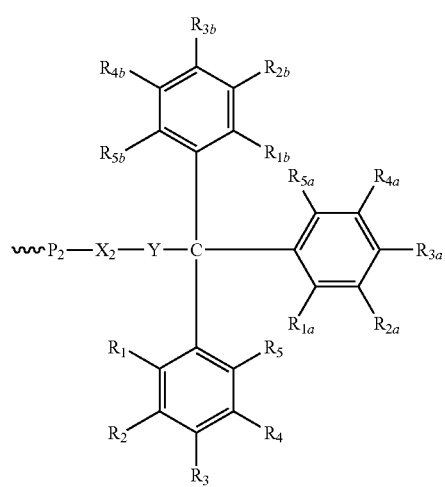

where $R_1$, $R_2$, $R_3$, $R_4$, $R_5$, $R_{1a}$, $R_{2a}$, $R_{3a}$, $R_{4a}$, $R_{5a}$, $R_{1b}$, $R_{2b}$, $R_{3b}$, $R_{4b}$, and $R_{5b}$ are independently a hydrogen, an alkyl, an alkyloxy, an alkyloxycarbonyl, an alkoxyloxycarbonyloxy, a fluoroalkyl, a fluoroalkyloxy, an aryloxy, an aryloxycarbonyl, an aryloxycarbonyloxy, a trialkylsilyl, a trialkylsilyloxy, Cl, Br, or I.

6. The composition of claim 5 where in the polymer, the repeat units of structure (Ia) are selected from ones having structure (III), structure (IV), structure (V), structure (VI) and mixtures thereof;

(III)

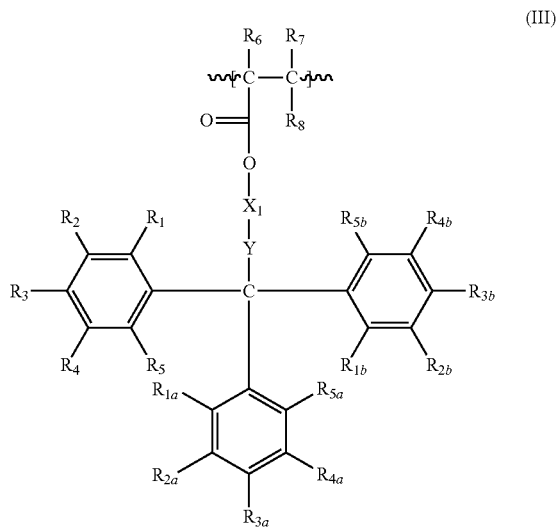

(IV)

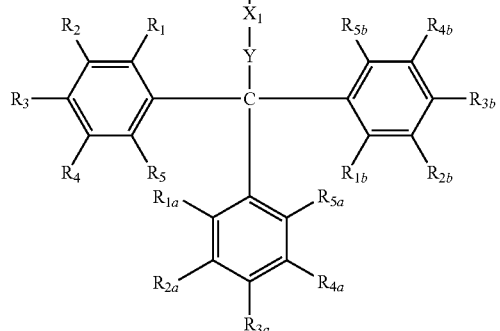

(V)

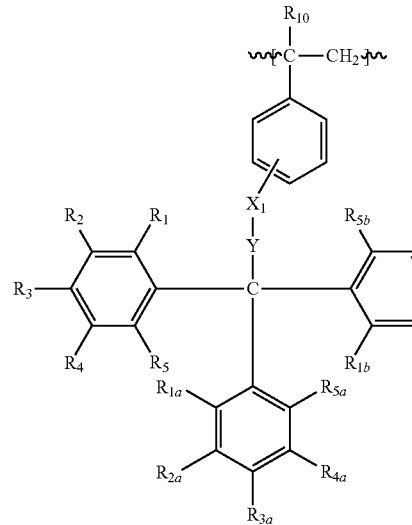

(VI)

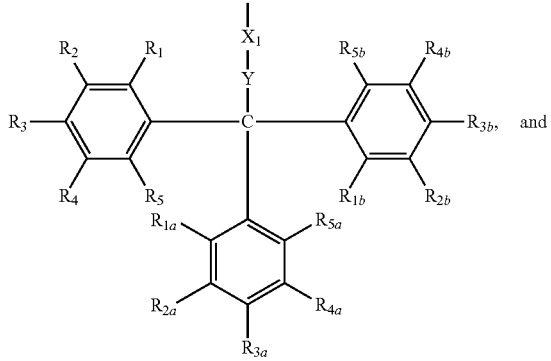

and where $R_6$ is a hydrogen, Cl, Br, CN, an alkyl, or a fluoroalkyl, and $R_7$ and $R_8$ are independently hydrogen, an alkyl, an alkoxycarbonyl, or $CO_2H$, and $R_9$ is hydrogen or an alkyl, and
$R_{10}$ is a hydrogen or an alkyl, and
$R_{11}$ is a hydrogen or an alkyl, and
$R_{12}$ and $R_{13}$ are independently hydrogen or an alkyl.

7. The composition of claim 5 where in the polymer the end group of structure (IIa) is selected from ones having structure (IIIa), structure (IVa), structure (Va) and structure (VIa);

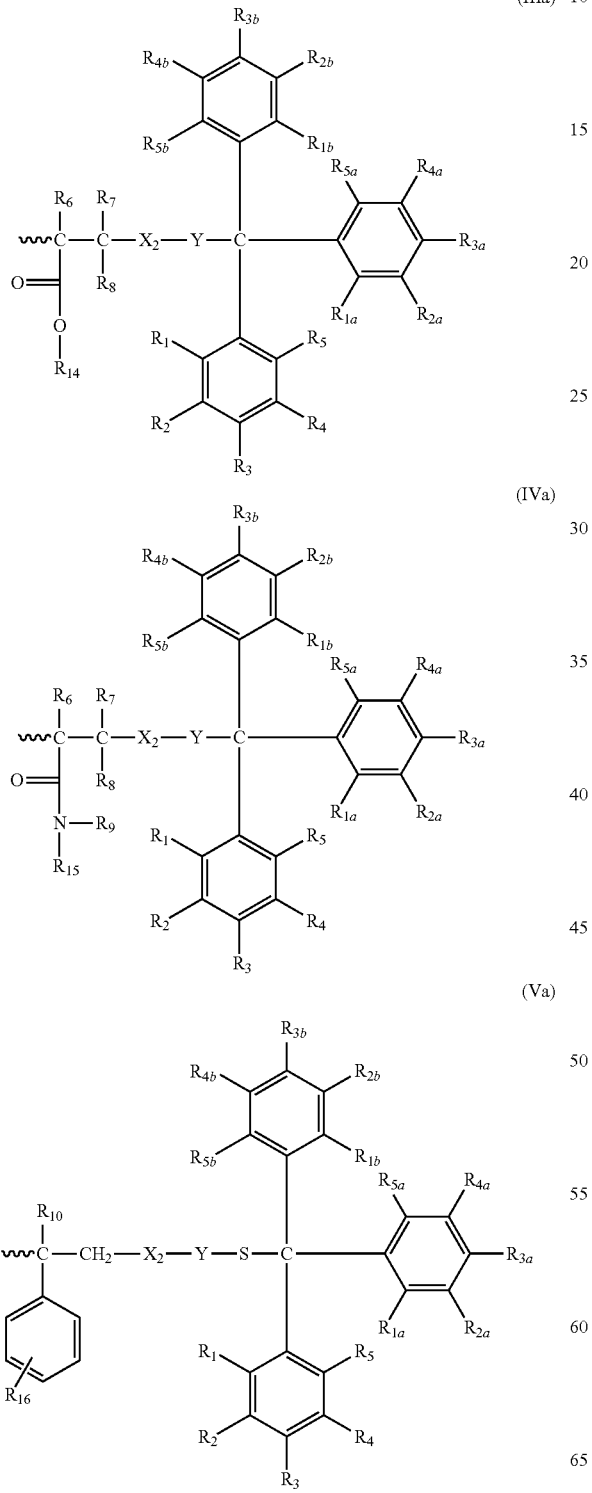

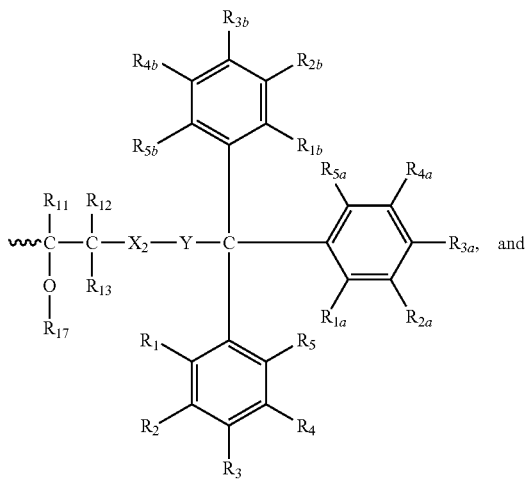

where $R_6$ is hydrogen, Cl, Br, CN, an alkyl, or a fluoroalkyl, and $R_7$ and $R_8$ are independently hydrogen, an alkyl, an alkoxycarbonyl, or $CO_2H$, and $R_{10}$ is an alkyl, and $R_9$, $R_{14}$, $R_{15}$ and $R_{17}$ are independently hydrogen, an alkyl, a fluoroalkyl, an alkoxy, an aryl, or an alkylenearyl, and $R_{16}$ is hydrogen, an alkyl, a fluoroalkyl, an alkoxy, an alkoxycarbonyl, an alkoxycarbonyloxy, an aryl, an aryloxy, an alkylenearyl, a trialkylsilyl, or a trialkylsiloxy.

8. The composition of claim 5 where the polymer further comprises polymer repeat units not having a pendant triarylmethyl chalcogenide moieties selected from ones having structures (VII), (VIII), (VIV), and (VV),

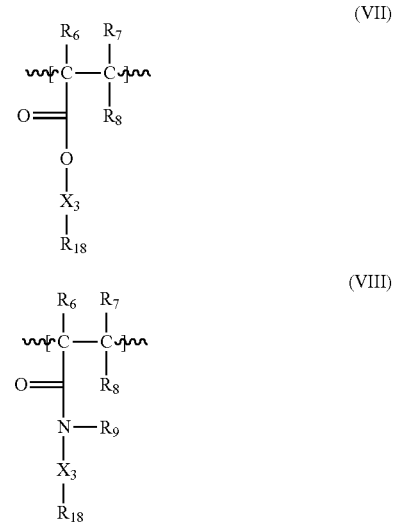

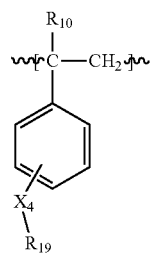

(VIV)

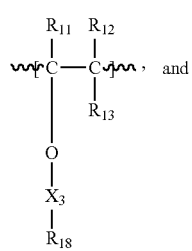

(VV)

where X₃ is an alkylene, a fluoroalkylene, an arylene, a fluoroarylene, a carbonyl, a carbonyloxy, or a direct valence bond, X₄ is an alkylene, a fluoroalkylene, an arylene spacer, a fluoroarylene, an oxy, a carbonyl, a carbonyloxy, an oxycarbonyloxy or a direct valence bond, R₁₈ is H, an alkyl, a fluoroalkyl, a trialkylsilyl, an aryl, a fluoroaryl, or an arylene(trialkylsilyl), R₁₉ is an alkyl, a fluoroalkyl, a trialkylsilyl, an aryl, a fluoroaryl, or an arylene(trialkylsilyl).

9. The composition of claim 5 where the polymer only comprises an end group (IIa) and repeat units not having a pendant triarylmethyl chalcogenide moieties selected from the group consisting of ones having structures (VII), (VIII), (VIV), (VV), and mixtures of these

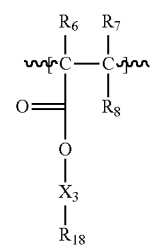

(VII)

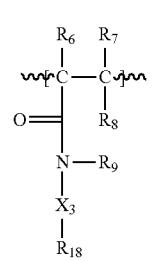

(VIII)

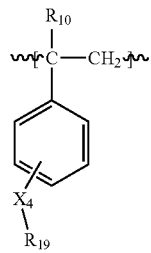

(VIV)

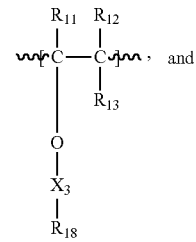

(VV)

where X₃ is an alkylene, a fluoroalkylene, an arylene, a fluoroarylene, a carbonyl, a carbonyloxy, or a direct valence bond, X₄ is an alkylene, a fluoroalkylene, an arylene spacer, a fluoroarylene, an oxy, a carbonyl, a carbonyloxy, an oxycarbonyloxy or a direct valence bond, R₁₈ is H, an alkyl, a fluoroalkyl, a trialkylsilyl, an aryl, a fluoroaryl, or an arylene(trialkylsilyl), and R₁₉ is an alkyl, a fluoroalkyl, a trialkylsilyl, an aryl, a fluoroaryl, or an arylene(trialkylsilyl).

10. The composition of claim 1, wherein said spin casting organic solvent is selected from the group consisting of a glycol ether derivative, a glycol ether ester derivative, a carboxylate, a carboxylate, of a di-basic acid, a dicarboxylates of glycols, a hydroxy carboxylates, a ketone ester, an alkoxycarboxylic acid ester, a ketone derivative, a ketone ether derivative, a ketone alcohol derivative, a ketal, an acetal, gamma-butyrolactone (GBL), an amide derivative, anisole, and mixtures thereof.

11. The composition of claim 1, wherein said spin casting organic solvent is selected from the group consisting of
 a glycol ether derivative selected from the group consisting of ethyl cellosolve, methyl cellosolve, propylene glycol monomethyl ether (PGME), diethylene glycol monomethyl ether, diethylene glycol monoethyl ether, dipropylene glycol dimethyl ether, propylene glycol n-propyl ether, and diethylene glycol dimethyl ether;
 a glycol ether ester derivative selected from the group consisting of ethyl cellosolve acetate, methyl cellosolve acetate, and propylene glycol monomethyl ether acetate (PGMEA);
 a carboxylate selected from the group consisting of ethyl acetate, n-butyl acetate, and amyl acetate;
 a carboxylate of a di-basic acid, selected from the group consisting of diethyloxylate, and diethylmalonate;
 a dicarboxylates of a glycol selected from the group consisting of ethylene glycol diacetate and propylene glycol diacetate;
 a hydroxy carboxylate selected from the group consisting of methyl lactate, ethyl lactate (EL), ethyl glycolate, and ethyl-3-hydroxy propionate;
 a ketone ester selected from the group consisting of methyl pyruvate and ethyl pyruvate;
 an alkoxycarboxylic acid ester selected from the group consisting methyl 3-m ethoxypropionate, ethyl 3-ethoxypropionate, ethyl 2-hydroxy-2-methylpropionate, and methylethoxypropionate;

a ketone derivative selected from the group consisting of methyl ethyl ketone, acetyl acetone, cyclopentanone, cyclohexanone, and 2-heptanone;

a ketone ether derivative, selected from the group consisting of diacetone alcohol methyl ether;

a ketone alcohol derivative selected from the group consisting of acetol and diacetone alcohol;

a ketal or acetal selected from the group consisting of 1,3 dioxalane and diethoxypropane;

gamma-butyrolactone (GBL);

an amide derivative selected from the group consisting of dimethylacetamide and dimethylformamide;

anisole;

and mixtures thereof.

12. A process of forming a grafted coating film on a substrate comprised of steps a), b), and c):
   a) coating a film on a substrate using the composition of claim 1,
   b) baking the film at a temperature between 80 to 300° C., and
   c) washing the film with a solvent to remove un-grafted polymer leaving behind the grafted film.

13. A process for self-assembly comprised of steps a) to f):
   a) coating a film on a substrate using the composition of claim 1,
   b) baking the film at a temperature between 80 to 300° C.,
   c) washing the film with a solvent to remove un-grafted polymer leaving behind the grafted film,
   d) coating a film of a block copolymer on the grafted film,
   e) applying a solvent bake to remove solvent from coasting step d), and
   f) applying an annealing bake to enable self-assembly of the block copolymer.

14. A process of forming a grafted coating film selectively onto metal patterns on a patterned substrate containing metal patterns comprising steps a), b), and c);
   a) coating a film on a patterned substrate using the composition of claim 1 where Y is S, Se or Te,
   b) baking the film at a temperature between 100 to 250° C., and
   c) washing the film with a solvent to remove un-grafted polymer leaving behind the grafted film on the metal patterns.

15. A non-aqueous, graftable coating composition comprised of a homogenous solution of a polymer and a spin casting organic solvent, wherein
   the composition does not contain acidic compounds, coloring particles, pigments or dyes, and
   the polymer has a linear polymer chain structure which is comprised of repeat units derived from monomers containing a single polymerizable olefinic carbon double bond, and
   the polymer contains at least one triarylmethyl chalcogenide containing moiety as an end chain group unit of structure (IIa), and the polymer does not contain any repeat units or end groups containing water ionizable groups, ionic groups, free thiol groups, or free hydroxy groups,

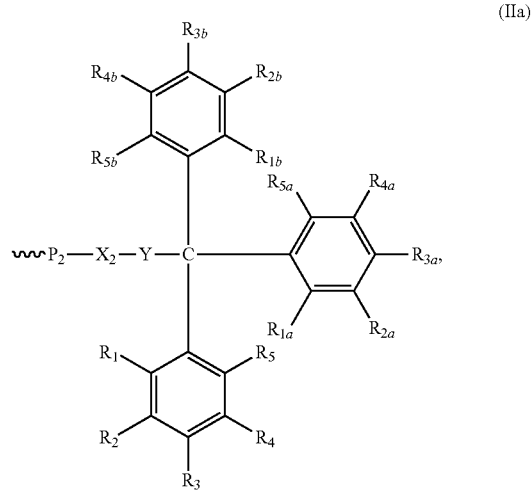

and where

Y is a chalcogen selected from O, S, Se or Te, and $X_2$ is an organic spacer, and $P_2$ is an end group moiety derived from a monomer containing a single polymerizable olefinic carbon double bond, ∿∿ represents a direct valence bond to the linear polymer, and where $R_1$, $R_2$, $R_3$, $R_4$, $R_5$, $R_{1a}$, $R_{2a}$, $R_{3a}$, $R_{4a}$, $R_{5a}$, $R_{1b}$, $R_{2b}$, $R_{3b}$, $R_{4b}$, and $R_{5b}$ are independently a hydrogen, an alkyl, an alkyloxy, an alkyloxycarbonyl, an alkoxyloxycarbonyloxy, a fluoroalkyl, a fluoroalkyloxy, an aryloxy, an aryloxycarbonyl, an aryloxycarbonyloxy, a trialkylsilyl, a trialkylsilyloxy, Cl, Br, or I, and where the polymer only comprises an end group (IIa) and repeat units not having a pendant triarylmethyl chalcogenide moieties selected from the group consisting of ones having structures (VII), (VIII), (VIV), (VV), and mixtures of these

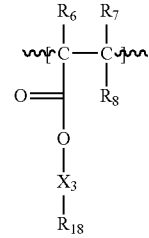

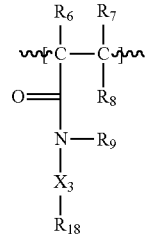

-continued

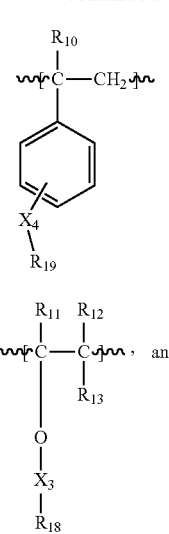

(VIV)

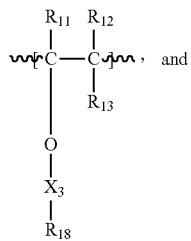

(VV)

where $X_3$ is an alkylene, a fluoroalkylene, an arylene, a fluoroarylene, a carbonyl, a carbonyloxy, or a direct valence bond, $X_4$ is an alkylene, a fluoroalkylene, an arylene spacer, a fluoroarylene, an oxy, a carbonyl, a carbonyloxy, an oxycarbonyloxy or a direct valence bond, $R_{18}$ is H, an alkyl, a fluoroalkyl, a trialkylsilyl, an aryl, a fluoroaryl, or an arylene(trialkylsilyl), and $R_{19}$ is an alkyl, a fluoroalkyl, a trialkylsilyl, an aryl, a fluoroaryl, or an arylene(trialkylsilyl).

16. A process of forming a grafted coating film on a substrate comprised of steps a), b), and c):
  a) coating a film on a substrate using the composition of claim 15,
  b) baking the film at a temperature between 80 to 300° C., and
  c) washing the film with a solvent to remove un-grafted polymer leaving behind the grafted film.

17. A process for self-assembly comprising steps a) to f):
  a) coating a film on a substrate using the composition of claim 15,
  b) baking the film at a temperature between 80 to 300° C.,
  c) washing the film with a solvent to remove un-grafted polymer leaving behind the grafted film,
  d) coating a film of a block copolymer on the grafted film,
  e) applying a solvent bake to remove solvent from coating step d), and
  f) applying an annealing bake to enable self-assembly of the block copolymer.

* * * * *